US011606522B2

United States Patent
Chiba et al.

(10) Patent No.: US 11,606,522 B2
(45) Date of Patent: Mar. 14, 2023

(54) COMPARATOR AND IMAGING DEVICE

(71) Applicant: Sony Semiconductor Solutions Corporation, Kanagawa (JP)

(72) Inventors: Masayoshi Chiba, Kanagawa (JP); Shinichi Watanabe, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/879,481

(22) Filed: Aug. 2, 2022

(65) Prior Publication Data

US 2022/0368843 A1     Nov. 17, 2022

Related U.S. Application Data

(63) Continuation of application No. 17/257,410, filed as application No. PCT/JP2019/025040 on Jun. 25, 2019, now Pat. No. 11,438,538.

(30) Foreign Application Priority Data

Jul. 9, 2018  (JP) .............................. JP2018-129693

(51) Int. Cl.
*H04N 5/369* (2011.01)
*H04N 5/3745* (2011.01)

(52) U.S. Cl.
CPC ....... *H04N 5/3698* (2013.01); *H04N 5/37455* (2013.01)

(58) Field of Classification Search
CPC .. H04N 5/3698; H04N 5/37455; H04N 5/378; H03F 2203/45674; H03F 3/082;
(Continued)

(56) References Cited

U.S. PATENT DOCUMENTS

2012/0133808 A1* 5/2012 Park .................. H04N 5/357
                                                       348/294
2015/0138411 A1  5/2015 Nakamura et al.
(Continued)

FOREIGN PATENT DOCUMENTS

JP          05-102755 A    4/1993
JP       2003-188662 A    7/2003
(Continued)

OTHER PUBLICATIONS

International Search Report (PCT/ISA/210), International Application No. PCT/JP2019/025040, dated Aug. 19, 2019.
(Continued)

*Primary Examiner* — Lin Ye
*Assistant Examiner* — Chan T Nguyen
(74) *Attorney, Agent, or Firm* — Michael Best & Friedrich LLP

(57) ABSTRACT

The present technology relates to a comparator that can easily modify operating point potential of the comparator, and an imaging device. A pixel signal output from a pixel, and, a reference signal with changeable voltage are input to a differential pair. A current mirror connected to the differential pair, and a voltage drop mechanism allowed to cause a predetermined voltage drop is connected between a transistor that configures the differential pair, and a transistor that configures the current mirror. A switch is connected in parallel to the voltage drop mechanism. The present technology can be applied, for example, to an image sensor that captures an image.

11 Claims, 22 Drawing Sheets

(58) Field of Classification Search
CPC ....... H03F 2203/45396; H03F 3/45183; H03F 3/45475; H03M 1/1295; H03M 1/123; H03M 1/56; H03K 5/2481; H03K 5/08
USPC ......................................................... 348/308
See application file for complete search history.

(56) References Cited

U.S. PATENT DOCUMENTS

| | | | |
|---|---|---|---|
| 2015/0187335 A1 | 7/2015 | Sugiyama et al. | |
| 2016/0301886 A1* | 10/2016 | Muto | H04N 5/3575 |
| 2018/0085820 A1 | 3/2018 | Otto | |
| 2018/0091752 A1* | 3/2018 | Ebihara | H03K 5/2481 |
| 2018/0109744 A1* | 4/2018 | Hanzawa | H03K 5/08 |

FOREIGN PATENT DOCUMENTS

| | | | |
|---|---|---|---|
| JP | 2014-75705 A | 4/2014 | |
| JP | 2015-97304 A | 5/2015 | |
| WO | 2016/163228 A1 | 10/2016 | |

OTHER PUBLICATIONS

Notification of Transmittal of the International Search Report and the Written Opinion of the International Searching Authority, or the Declaration (PCT/ISA/220), International Application No. PCT/JP2019/025040, dated Sep. 3, 2019.
Written Opinion of the International Search Authority (PCT/ISA/237), International Application No. PCT/JP2019/025040, dated Sep. 3, 2019.

* cited by examiner

COMPARATOR AND IMAGING DEVICE

CROSS REFERENCES TO RELATED APPLICATIONS

This application is a Continuation Application of patent application Ser. No. 17/257,410, filed Dec. 31, 2020, which is a National Stage Application of International Patent Application No.: PCT/JP2019/025040, filed Jun. 25, 2019, which claims priority to Japanese Patent Application JP 2018-129693, filed in the Japan Patent Office on Jul. 9, 2018, the entire contents of which being incorporated herein by reference.

TECHNICAL FIELD

The present technology relates to a comparator and an imaging device, and particularly, for example, to a comparator that can easily modify operating point potential of the comparator, and an imaging device.

BACKGROUND ART

For example, complementary metal oxide semiconductor (CMOS) image sensor has, typically for every column of pixels, an AD converter (ADC) that carries out analog-to-digital (AD) conversion of an analog pixel signal, output from each pixel having a photoelectric conversion element that carries out photoelectric conversion, such as photodiode (PD).

As the ADC for the CMOS image sensor, for example, there has been known a so-called single-slope type ADC, typically having a comparator and a counter, and carries out AD conversion of the pixel signal, by comparing a predetermined reference signal with the pixel signal output from the pixel.

According to the single-slope type ADC, the reference signal with a voltage changeable at a constant slope, such as RAMP signal, is compared by the comparator with the pixel signal output from the pixel, and a time required for change of voltage of the reference signal, until levels of the reference signal and the pixel signal will coincide, is counted by the counter, thus enabling AD conversion of the pixel signal output from the pixel.

In the CMOS image sensor, correlated double sampling (CDS) is carried out to determine a difference between a result of AD conversion at a reset level, which is a pixel signal immediately after resetting the pixel, and a result of AD conversion at a signal level, which is a charge-correlated pixel signal that contains charge accumulated in the PD of the pixel after being reset, and the difference obtained by CDS is output as a pixel value.

By the way, the CMOS image sensor that employs the single-slope type ADC carries out, prior to the AD conversion, an auto-zero operation that determines operating point potential of the comparator. In the auto-zero operation, the comparator is set so that the pixel signal and the reference signal, which are input to (a differential pair that configures) the comparator, will have the same potential called auto-zero potential.

Patent Document 1 describes a technology of modifying the auto-zero potential, by allowing an externally applied voltage generation circuit that is provided outside of the comparator to generate an externally applied voltage, and then by feeding the externally applied voltage to the comparator.

CITATION LIST

Patent Document

Patent Document 1: Japanese Patent Application Laid-Open No. 2014-197772

SUMMARY OF THE INVENTION

Problems to be Solved by the Invention

In recent years, there has been a request for proposal of a technology that can easily modify the auto-zero potential of the auto-zero operation, that is, the operating point potential of the comparator.

The present technology has been arrived at in consideration of the aforementioned situation, and is to enable easy modification of the operating point potential of the comparator.

Solution to Problems

A comparator according to the present technology includes a differential pair to which a pixel signal output from a pixel, and, a reference signal with changeable voltage are input, a current mirror connected to the differential pair, a voltage drop mechanism that is connected between a transistor that configures the differential pair, and a transistor that configures the current mirror, being allowed to cause a predetermined voltage drop, and a switch connected in parallel to the voltage drop mechanism.

An imaging device according to the present technology includes a pixel that outputs a pixel signal as a result of photoelectric conversion, a comparator that compares the pixel signal, and a reference signal with changeable voltage, and a counter that counts a length of time required for change of the reference signal until the pixel signal and the reference signal will coincide, on the basis of a result of comparison between the pixel signal and the reference signal given by the comparator, and determines an obtained count value as a result of analog-to-digital (AD) conversion of the pixel signal. The comparator includes a differential pair to which the pixel signal and the reference signal are input, a current mirror connected to the differential pair, a voltage drop mechanism that is connected between a transistor that configures the differential pair, and a transistor that configures the current mirror, being allowed to cause a predetermined voltage drop, and a switch connected in parallel to the voltage drop mechanism.

In the comparator and the imaging device of the present technology, the voltage drop mechanism causing a predetermined voltage drop is connected between the transistor that configures the differential pair to which the pixel signal output from the pixel, and, the reference signal with variable voltage are input, and the transistor that configures the current mirror connected to the differential pair, in which the switch is connected in parallel to the voltage drop mechanism.

The comparator and the imaging device may be devices (including chips and modules) independent from each other, or may be internal blocks that configure a single device.

Effects of the Invention

According to the present technology, the operating point potential of the comparator may be modified easily.

Note that in this connection, the effects described here are not necessarily limited, and may be any of the effects described in the present disclosure.

MODE FOR CARRYING OUT THE INVENTION

<One Embodiment of Digital Camera to which Present Technology is Applied>

Figure 1:
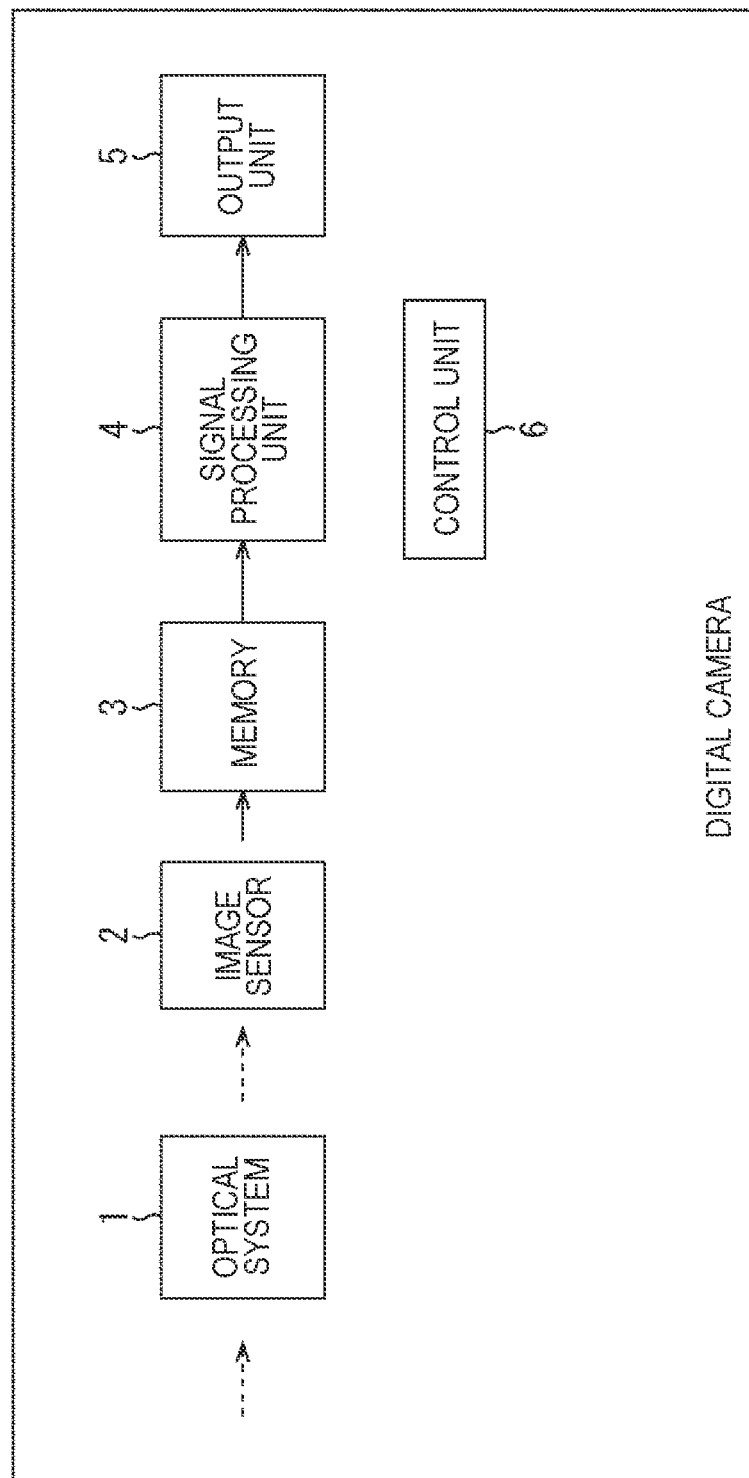
FIG. 1 is a block diagram illustrating an exemplary configuration of an embodiment of a digital camera to which the present technology is applied.

FIG. 1 is a block diagram illustrating an exemplary configuration of an embodiment of a digital camera to which the present technology is applied.

Note that the digital camera can capture both of still image and video.

The digital camera in FIG. 1 has an optical system 1, an image sensor 2, a memory 3, a signal processing unit 4, an output unit 5, and, a control unit 6.

The optical system 1 typically has, for example, an unillustrated zoom lens, focusing lens, a stop and so forth, and allows external light to enter the image sensor 2.

The image sensor 2 typically includes an imaging device such as complementary metal oxide semiconductor (CMOS) image sensor, and receives incident light from the optical system 1, carries out photoelectric conversion, and outputs image data that corresponds to the incident light from the optical system 1.

The memory 3 temporarily stores the image data output from the image sensor 2.

The signal processing unit 4 carries out signal processing by using image data stored in the memory 3, such as noise removal and white balance adjustment for example, and supplies the image data to the output unit 5.

The output unit 5 outputs the image data received from the signal processing unit 4.

That is, the output unit 5 has a display (not illustrated) that typically contains liquid crystal or the like, and displays an image that corresponds to the image data received from the signal processing unit 4 as a so-called through image.

In addition, the output unit 5 typically has a semiconductor memory, and a driver (not illustrated) that drives a recording medium such as magnetic disk, optical disk or the like, and saves the image data received from the signal processing unit 4 to the recording medium.

The control unit 6 controls the individual blocks that configure the digital camera, in response to an operation or the like of the user.

According to the thus configured digital camera, the image sensor 2 receives the incident light from the optical system 1, and outputs the image data corresponding to the incident light.

The image data output by the image sensor 2 is supplied to, and then stored in the memory 3. The image data stored in the memory 3 is subjected to signal processing by the signal processing unit 4, and the resultant image data is supplied to, and then output from the output unit 5.

<Exemplary Configuration of Image Sensor 2>

Figure 2:
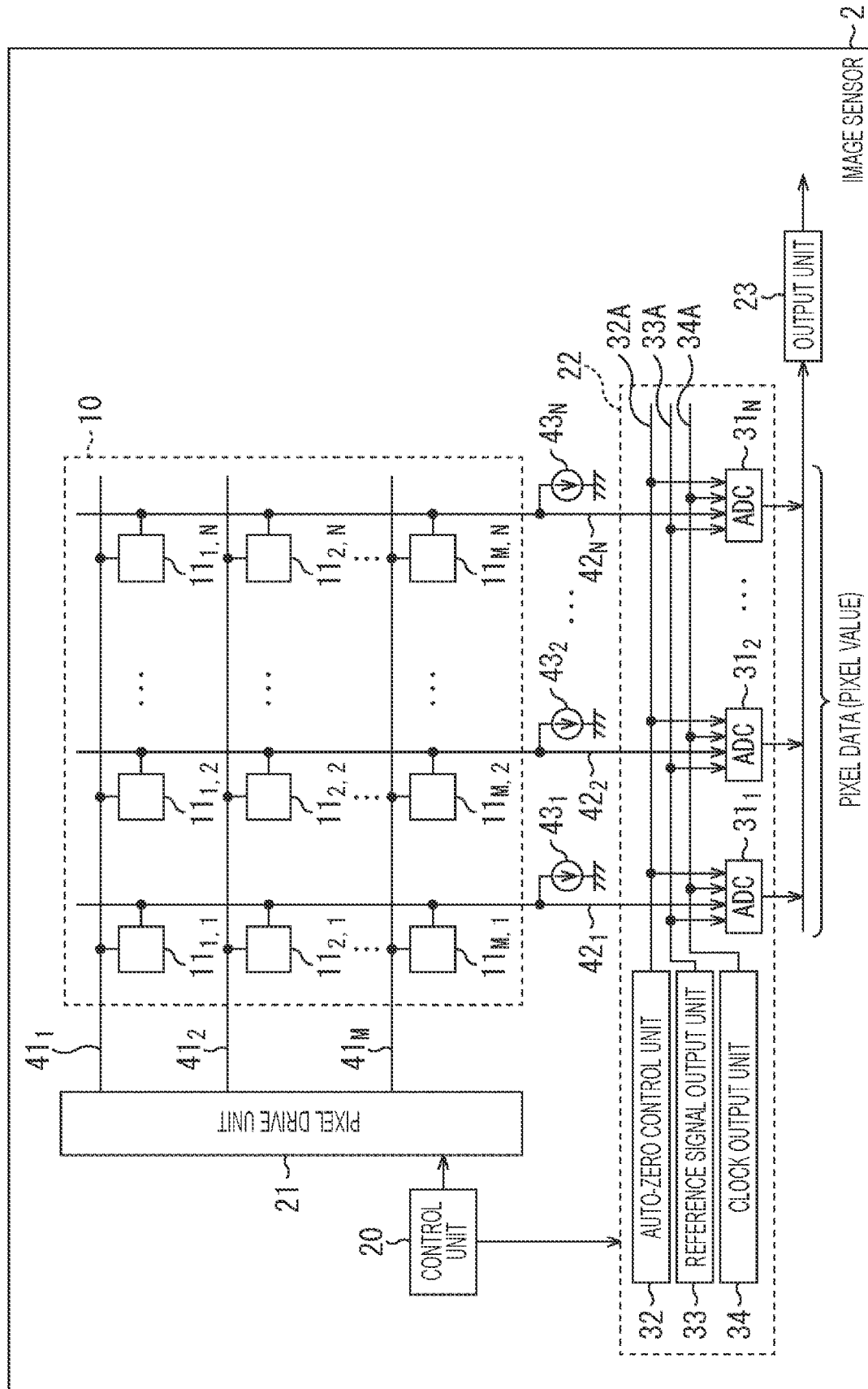
FIG. 2 is a block diagram illustrating an exemplary configuration of an image sensor 2.

FIG. 2 is a block diagram illustrating an exemplary configuration of an image sensor 2 in FIG. 1.

The image sensor 2 illustrated in FIG. 2 has a pixel array 10, a control unit 20, a pixel drive unit 21, a column-parallel AD conversion unit 22, and, an output unit 23.

The pixel array 10 has M×N (each of M and N represents an integer of 1 or larger) pixels $11_{1,1}$, $11_{1,2}$, ..., $11_{1,N}$, $11_{2,1}$, $11_{2,2}$, ..., $11_{2,N}$, ..., $11_{M,1}$, $11_{M,2}$, ..., $11_{M,N}$ that take part in photoelectric conversion, and functions as an imaging unit (imaging element) that captures image.

M×N pixels $11_{1,1}$ to $11_{M,N}$ are arranged on a two-dimensional plane so as to form an M-row N-column matrix (array).

To each of N pixels $11_{m,1}$ to $11_{m,N}$ arranged in the row direction (transverse direction) on the m-th row (from the top) (m=1, 2, ..., M) of the pixel array 10, connected is a pixel control line $41_m$ that extends in the row direction.

Meanwhile, to each of M pixels $11_{1,n}$ to $11_{m,n}$ arranged in the column direction (vertical direction) on the n-th column (from the left) (n=1, 2, ..., N), connected is a vertical signal line (VSL) $42_n$ that extends in the column direction.

The pixel $11_{m,n}$ carries out photoelectric conversion of light that is incident thereon (incident light). In addition, the pixel $11_{m,n}$ outputs a pixel signal, which is voltage corresponded to electric charge obtained by the photoelectric conversion, to the VSL $42_n$ to which a current source $43_n$ is connected, while being controlled through the pixel control line $41_m$ by the pixel drive unit 21.

Note that, the pixel $11_{m,n}$ can typically take part in photoelectric conversion of light of a predetermined color that comes in through a color filter (not illustrated) with Bayer arrangement or the like, for example.

The control unit 20 controls the pixel drive unit 21, (an auto-zero control unit 32, a reference signal output unit 33 and so forth that configures) the column-parallel AD conversion unit 22, and other necessary blocks, according to a predetermined logic or the like.

The pixel drive unit 21 controls (drives), according to control by the control unit 20 through the pixel control line $41_m$, the pixels $11_{m,1}$ to $11_{m,N}$ connected to the pixel control line $41_m$.

The column-parallel AD conversion unit 22 is connected to each of the pixels $11_{m,1}$ to $11_{m,N}$ arranged in a row, respectively through the VSLs $42_1$ to $42_N$, so that, the pixel signal (voltage) (also referred to as VSL signal, hereinafter) output from the pixel $11_{m,n}$ onto the VSL $42_n$ is supplied to the column-parallel AD conversion unit 22.

The column-parallel AD conversion unit 22 is a processing device that carries out, in a parallel manner, the AD conversion of the VSL signals supplied from each of the pixels $11_{m,1}$ to $11_{m,N}$ arranged in a row, respectively through the VSLs $42_1$ to $42_N$, and then supplies digital data resulted from the AD conversion, which are pixel values (pixel data) of the pixels $11_{m,1}$ to $11_{m,N}$, to the output unit 23.

Now, the column-parallel AD conversion unit 22 can not only carry out, in a parallel manner, the AD conversion of the pixel signals from all of N pixels $11_{m,1}$ to $11_{m,N}$ arranged in a row, but can also carry out, in a parallel manner, the AD conversion of the pixel signals from one or more and less than N pixels from among N pixels $11_{m,1}$ to $11_{m,N}$.

Note, however, that the column-parallel AD conversion unit 22 in the following explanation is defined to carry out the AD conversion of the VSL signals from all of N pixels $11_{m,1}$ to $11_{m,N}$ arranged in a row, for simplicity of explanation.

The column-parallel AD conversion unit 22 has N analog-to-digital converters (ADCs) $31_1$ to $31_N$, so as to enable, in a parallel manner, the AD conversion of the VSL signals from all of N pixels $11_{m,1}$ to $11_{m,N}$ arranged in a row.

Moreover, the column-parallel AD conversion unit 22 has the auto-zero control unit 32, the reference signal output unit 33, and, a clock output unit 34.

The auto-zero control unit 32 supplies (outputs) an auto-zero pulse (auto-zero signal), which is a signal for controlling auto-zero operation of a comparator $61_n$ described later contained in the ADC $31_n$, through an auto-zero signal line 32A, to each of the ADCs $31_1$ to $31_N$.

The reference signal output unit 33 typically includes a digital-to-analog converter (DAC), and supplies (outputs) reference signal, such as ramp (RAMP) signal, with the voltage variable from a predetermined initial value up to a predetermined final value at a constant slope, through a reference signal line 33A, to each of the ADCs $31_1$ to $31_N$.

The clock output unit 34 supplies (outputs) a clock having a predetermined frequency through a clock signal line 34A to each of the ADCs $31_1$ to $31_N$.

The ADC $31_n$ is connected to a VSL $41_n$, so that, to the ADC $31_n$, supplied is a VSL signal (pixel signal) output by the pixel $11_{m,n}$ on the VSL $41_n$.

The ADC $31_n$ carries out AD conversion of the VSL signal output from the pixel $11_{m,n}$, by using the reference signal from the reference signal output unit 33, and, the clock from the clock output unit 34, and further carries out correlated double sampling (CDS) to determine digital data as the pixel value.

Now, the ADC $31_n$ carries out AD conversion of the VSL signal from the pixel $11_{m,n}$, by comparing the VSL signal from the pixel $11_{m,n}$ with the reference signal from the reference signal output unit 33, and by counting a length of time required for change of voltage of the reference signal, until voltage levels of the VSL signal from the pixel $11_{m,n}$ and the reference signal will coincide (until level relation between the VSL signal and the reference signal will be inverted).

In the ADC $31_n$, counting of a length of time, required for change of voltage of the reference signal, until voltage levels of the VSL signal from the pixel $11_{m,n}$ and the reference signal will coincide, is embodied by counting a clock received from the clock output unit 34.

In addition, to N units of ADCs $31_1$ to $31_N$, supplied are VSL signals from N pixels $11_{m,1}$ to $11_{m,N}$ in every row from the first row to the M-th row in the pixel array 10, started sequentially for example from the first row, enabling AD conversion and CDS of the VSL signals row by row.

The output unit 23 selects row "n" from which a pixel value is read out, and reads as the pixel value a result of AD conversion (and CDS) of the pixel $11_{m,n}$ determined by the ADC $31_n$, out from such ADC $31_n$ in the row "n", and outputs the result to the outside (memory 3 (FIG. 1), in this embodiment).

Note that, although having described a case where the ADC $31_n$ carries out the AD conversion as well as CDS, the ADC $31_n$ may alternatively carry out the AD conversion only, while allowing the output unit 23 to carry out CDS.

Also note that the following description will properly skip the explanation on CDS.

<Exemplary Configuration of Pixel $11_{m,n}$>

Figure 3:
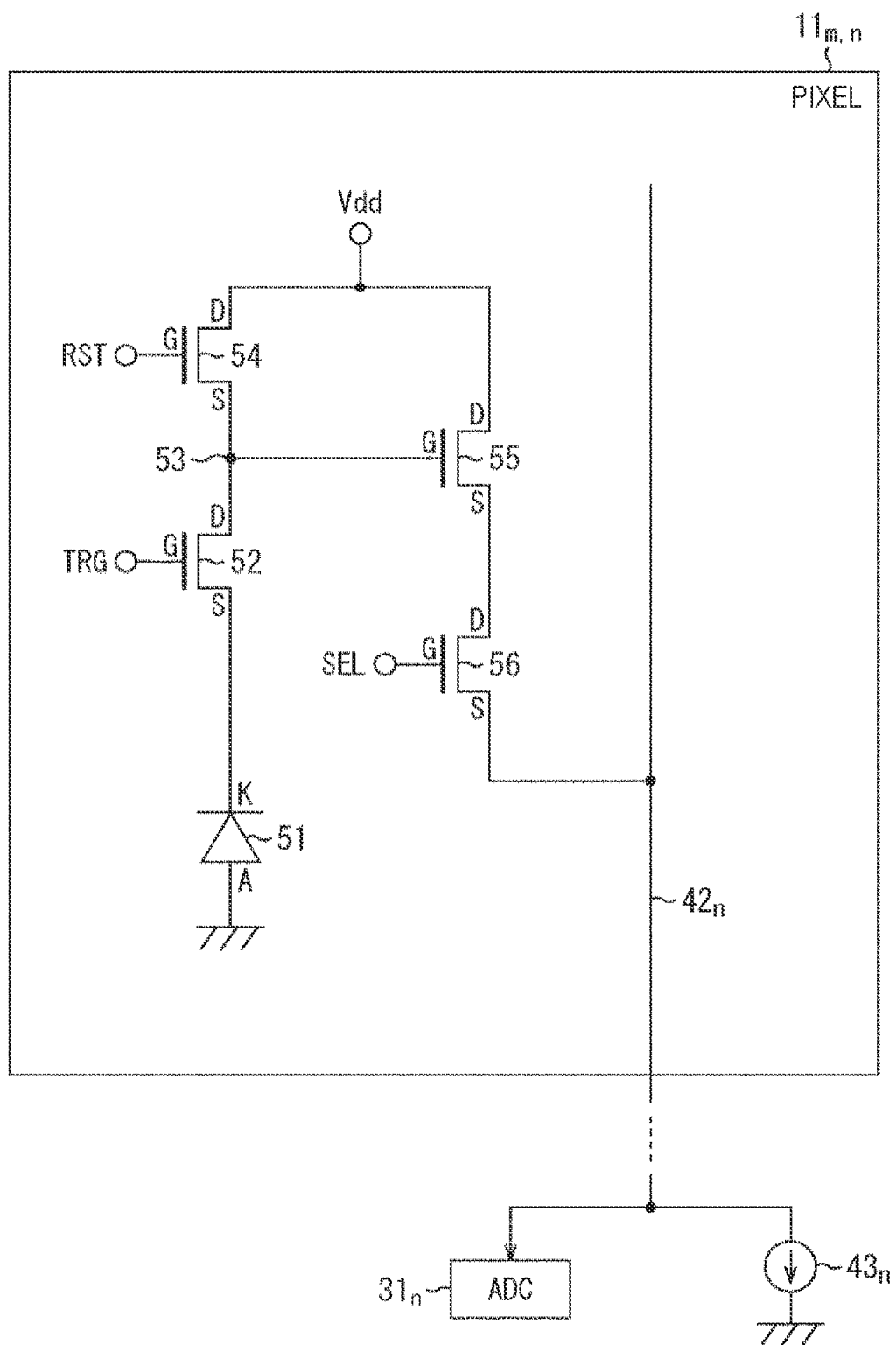
FIG. 3 is a circuit diagram illustrating an exemplary configuration of a pixel $11_{m,n}$.

FIG. 3 is a circuit diagram illustrating an exemplary configuration of a pixel $11_{m,n}$ in FIG. 2.

The pixel $11_{m,n}$ in FIG. 3 has a PD 51, as well as, four field effect transistors (FETs) 52, 54, 55 and 56 of negative channel MOS (NMOS) type.

In addition in the pixel $11_{m,n}$, there are connected the drain of an FET 52, the source of an FET 54, and, the gate of an FET 55, and at a node among them, there is formed a floating diffusion (FD) (capacitance) 53 that converts electric charge into voltage.

The PD 51 is an exemplary photoelectric conversion element that takes part in photoelectric conversion, in which the photoelectric conversion is carried out by receiving incident light, and then by accumulating electric charge corresponded to the incident light.

The anode of the PD 51 is connected to the ground (earthed), and the cathode of the PD 51 is connected to the source of the FET 52.

The FET 52 is an FET that transfers electric charge accumulated in the PD 51, from the PD 51 to the FD 53, which will also be referred to as a transfer Tr 52 herein after.

The source of the transfer Tr 52 is connected to the cathode of the PD 51, and the drain of the transfer Tr 52 is connected through the FD 53 to the source of the FET 54.

In addition, the gate of the transfer Tr 52 is connected to the pixel control line $41_m$, and, to the gate of the transfer Tr 52, supplied is a transfer pulse TRG through the pixel control line $41_m$.

Now, in order to enable the pixel drive unit 21 (FIG. 2) to drive (control) the pixel $11_{m,n}$ through the pixel control line $41_m$, a control signal (voltage) to be supplied to the pixel control line $41_m$ includes not only the transfer pulse TRG, but also a reset pulse RST described later, and, a selection pulse SEL.

The FD 53 is a region formed at the node of connection of the drain of the transfer Tr 52, the source of the FET 54, and, the gate of the FET 55, which converts electric charge into voltage like a capacitor.

The FET 54 is an FET that resets the electric charge (voltage (potential)) accumulated in the FD 53, which will also be referred to as a reset Tr 54 hereinafter.

The drain of the reset Tr 54 is connected to a power source Vdd.

In addition, the gate of the reset Tr 54 is connected to the pixel control line $41_m$, and, to the gate of the reset Tr 54, supplied is a reset pulse RST through the pixel control line $41_m$.

The FET 55 is an FET that buffers voltage of the FD 53, which will also be referred to as an amplification Tr 55.

The gate of the amplification Tr 55 is connected to the FD 53, and the drain of the amplification Tr 55 is connected to the power source Vdd. In addition, the source of the amplification Tr 55 is connected to the drain of the FET 56.

The FET 56 is an FET that selects output of the pixel signal (VSL signal) to the VSL $42_n$, which will also be referred to as a selection Tr 56 hereinafter.

The source of the selection Tr 56 is connected to the VSL $42_n$.

In addition, the gate of the selection Tr 56 is connected to the pixel control line $41_m$, and, to the gate of the selection Tr 56, supplied is the selection pulse SEL through the pixel control line $41_m$.

Now, a (circuit of) source follower (SF) is formed by the amplification Tr 55 and the current source $43_n$, as a result of connection of the source of the amplification Tr 55 through the selection Tr 56 and the VSL $42_n$ to the current source $43_n$, so that, voltage of the FD 53 serves as the VSL signal on the VSL $42_n$ via the SF.

Note that the pixel $11_{m,n}$ may be configured without the selection Tr 56.

Moreover, configuration of the pixel $11_{m,n}$ may employ a common pixel configuration in which the FD 53 to selection Tr 56 are shared by a plurality of PDs 51 and transfer Trs 52.

In the thus configured pixel $11_{m,n}$, the PD 51 receives light that is incident thereon, and carries out photoelectric conversion to start accumulation of electric charge corresponding to the amount of energy of the received incident light.

Note that, the selection pulse SEL is assumed to be at H level, and the selection Tr 56 is kept in ON state, for simplicity of explanation.

Upon start of the accumulation of electric charge in the PD 51, and after the elapse of a predetermined length of time (exposure time), the pixel drive unit 21 (FIG. 2) temporarily brings the transfer pulse TRG (from low (L) level) to high (H) level.

With the transfer pulse TRG temporarily set to H level, the transfer Tr 52 temporarily comes into ON state.

Upon turning ON of the transfer Tr 52, the electric charge accumulated in the PD 51 is transferred through the transfer Tr 52 to the FD 53, and then accumulated therein.

The pixel drive unit 21 brings the reset pulse RST temporarily to H level, before bringing the transfer pulse TRG temporarily to H level, thus bringing the reset Tr 54 temporarily into ON state.

With the reset Tr 54 brought into ON state, the FD 53 is connected through the reset Tr 54 to the power source Vdd, and electric charge in the FD 53 is discharged through the reset Tr 54 towards the power source Vdd, for resetting.

Now, resetting of the electric charge in the FD 53, as a result of connection of the FD 53 to the power source Vdd as described above, is understood to be resetting of the pixel $11_{m,n}$.

After resetting the electric charge in the FD 53, the pixel drive unit 21 brings the transfer pulse TRG temporarily to H level as described above, thus bringing the transfer Tr 52 temporarily into ON state.

Upon turning ON of the transfer Tr 52, the electric charge accumulated in the PD 51 is transferred through the transfer Tr 52 to the FD 53 after being reset, and then accumulated therein.

Voltage (potential) corresponded to the electric charge accumulated in the FD 53 is output as the VSL signal, through the amplification Tr 55 and the selection Tr 56, onto the VSL $42_n$.

In the ADC $31_n$ (FIG. 2) connected to the VSL $42_n$, a reset level which is the VSL signal immediately after resetting of the pixel $11_{m,n}$ is subjected to AD conversion.

Further in the ADC $31_n$, a signal level (including the reset level, and the level assumed as the pixel level), which is the VSL signal after the transfer Tr 52 is temporarily brought into ON state (voltage corresponded to the electric charge accumulated in the PD 51, and transferred to the FD 53), is subjected to AD conversion.

Then in the ADC $31_n$, CDS is carried out to determine, as the pixel value, a difference between an AD conversion result of the reset level (also referred to as reset level AD value, hereinafter), and an AD conversion result of the signal level (also referred to as signal level AD value, hereinafter).

<Exemplary Configuration of ADC $31_n$>

Figure 4:
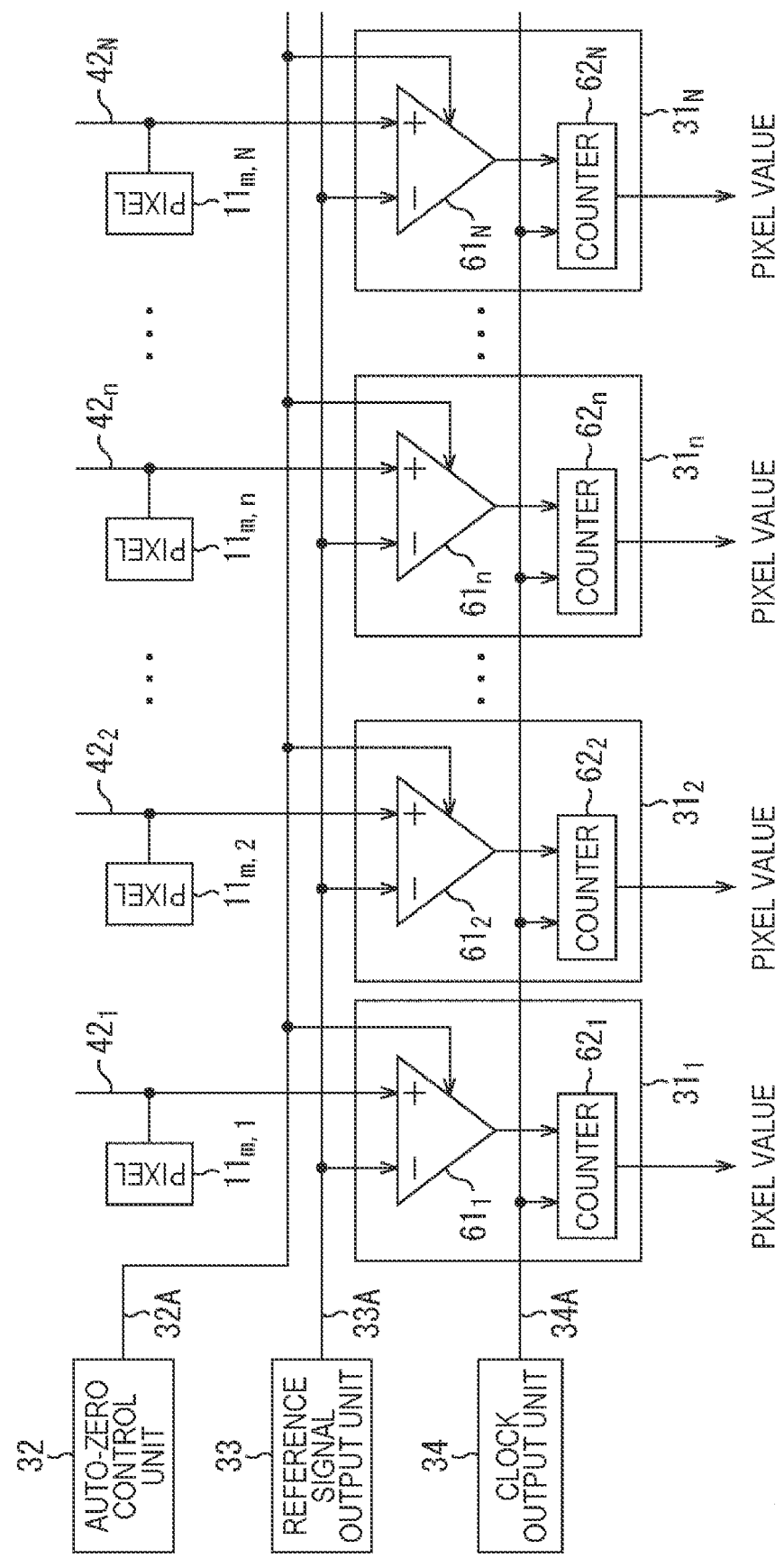
FIG. 4 is a block diagram illustrating an exemplary configuration of an ADC $31_n$.

FIG. 4 is a block diagram illustrating an exemplary configuration of an ADC $31_n$ in FIG. 2.

The ADC $31_n$ has the comparator $61_n$ and a counter $62_n$, and carries out single-slope type AD conversion, and, CDS.

The comparator $61_n$ has two input terminals, namely an inverting input terminal (−), and, a non-inverting input terminal (+).

To the inverting input terminal (−), which is one input terminal out of two input terminals of the comparator $61_n$, supplied is either the reference signal from the reference signal output unit 33, or, the VSL signal (reset level, signal level) of the pixel $11_{m,n}$, and supplied is, for example, the reference signal. To the non-inverting input terminal (+), which is the other input terminal out of two input terminals of the comparator $61_n$, supplied is the other one of the reference signal from the reference signal output unit 33, or, the VSL signal of the pixel $11_{m,n}$, and supplied is, for example, the VSL signal.

The comparator $61_n$ compares the reference signal to be supplied to the inverting input terminal, and the VSL signal to be supplied to the non-inverting input terminal, and outputs a result of comparison.

That is, in a case where the reference signal to be supplied to the inverting input terminal is larger than the VSL signal to be supplied to the non-inverting input terminal, the comparator $61_n$ outputs either one of H or L level, for example, L level.

Meanwhile, in a case where the VSL signal to be supplied to the non-inverting input terminal is larger than voltage of the reference signal to be supplied to the inverting input terminal, the comparator $61_n$ outputs the other one of H or L level, typically H level.

Note that, to the comparator $61_n$, supplied is the auto-zero pulse, through the auto-zero signal line 32A from the auto-zero control unit 32. In the comparator $61_n$, the auto-zero operation is carried out according to the auto-zero pulse from the auto-zero control unit 32, to determine the auto-zero potential which is the operation point potential of the comparator $61_n$.

Now in the auto-zero operation, the comparator is set so that the pixel signal and the reference signal to be input (supplied) to the comparator $61_n$ will have the same auto-zero potential. Accordingly in the auto-zero operation, the comparator $61_n$ is set so that the comparator $61_n$ can obtain a result of comparison that represents agreement of two input signals currently supplied to the comparator $61_n$, namely the signal currently supplied to the inverting input terminal of the comparator $61_n$, and the signal currently supplied to the non-inverting input terminal.

To the counter $62_n$, supplied are output of the comparator $61_n$, and the clock from the clock output unit 34.

The counter $62_n$, for example, starts to count the clock from the clock output unit 34, timely with start of change of (voltage of) the reference signal that is supplied from the reference signal output unit 33 to the comparator $61_n$, and, upon change of output of the comparator $61_n$ for example from L level to H level (or from H level to L level), that is, upon agreement of voltage levels of the reference signal to be supplied to the inverting input terminal, and the VSL signal to be supplied to the non-inverting input terminal of the comparator $61_n$ (upon inversion of level relation between the reference signal and the VSL signal), stops counting of the clock from the clock output unit 34.

The counter $62_n$ then outputs the clock count value as a result of AD conversion of the VSL signal supplied to the non-inverting input terminal of the comparator $61_n$.

Now, the reference signal output unit 33 typically outputs, as the reference signal, a RAMP signal with a voltage slope (sloped waveform) decreasing or increasing from a predetermined initial value to a predetermined final value at a constant rate.

In the counter $62_n$, a length of time over which the reference signal changes to coincide with the VSL signal supplied to the non-inverting input terminal of the comparator $61_n$ is counted from the start of slope, and a count value thus obtained by the counting is assumed to be a result of AD conversion of the VSL signal supplied to the non-inverting input terminal of the comparator $61_n$.

The ADC $31_n$ obtains the reset level as the VSL signal supplied from the pixel $11_{m,n}$ to the non-inverting input terminal of the comparator $61_n$, and, a result of the AD conversion of the signal level. The ADC $31_n$ then carries out CDS to determine a difference between AD conversion result of the signal level (signal level AD value), and AD conversion result of the reset level (reset level AD value), and outputs the difference obtained by CDS, as the pixel value of the pixel $11_{m,n}$.

Note that, in the ADC $31_n$, CDS may be carried out not only by actually calculating the difference between the signal level AD value and the reset level AD value, but also by controlling clock count by the counter $62_n$, for example.

That is, CDS for determining the difference between (the AD conversion result of) the signal level and (the AD conversion result of) the reset level may be carried out, concurrently with AD conversion of the reset level and the signal level, by allowing the counter $62_n$ to count the clock, while for example decrementing, for the reset level, the count value one by one, or while incrementing, for the signal level, the count value one by one conversely to the reset level, assuming the clock count value for the reset level as the initial value.

<First Exemplary Configuration of Comparator $61_n$>

Figure 5:
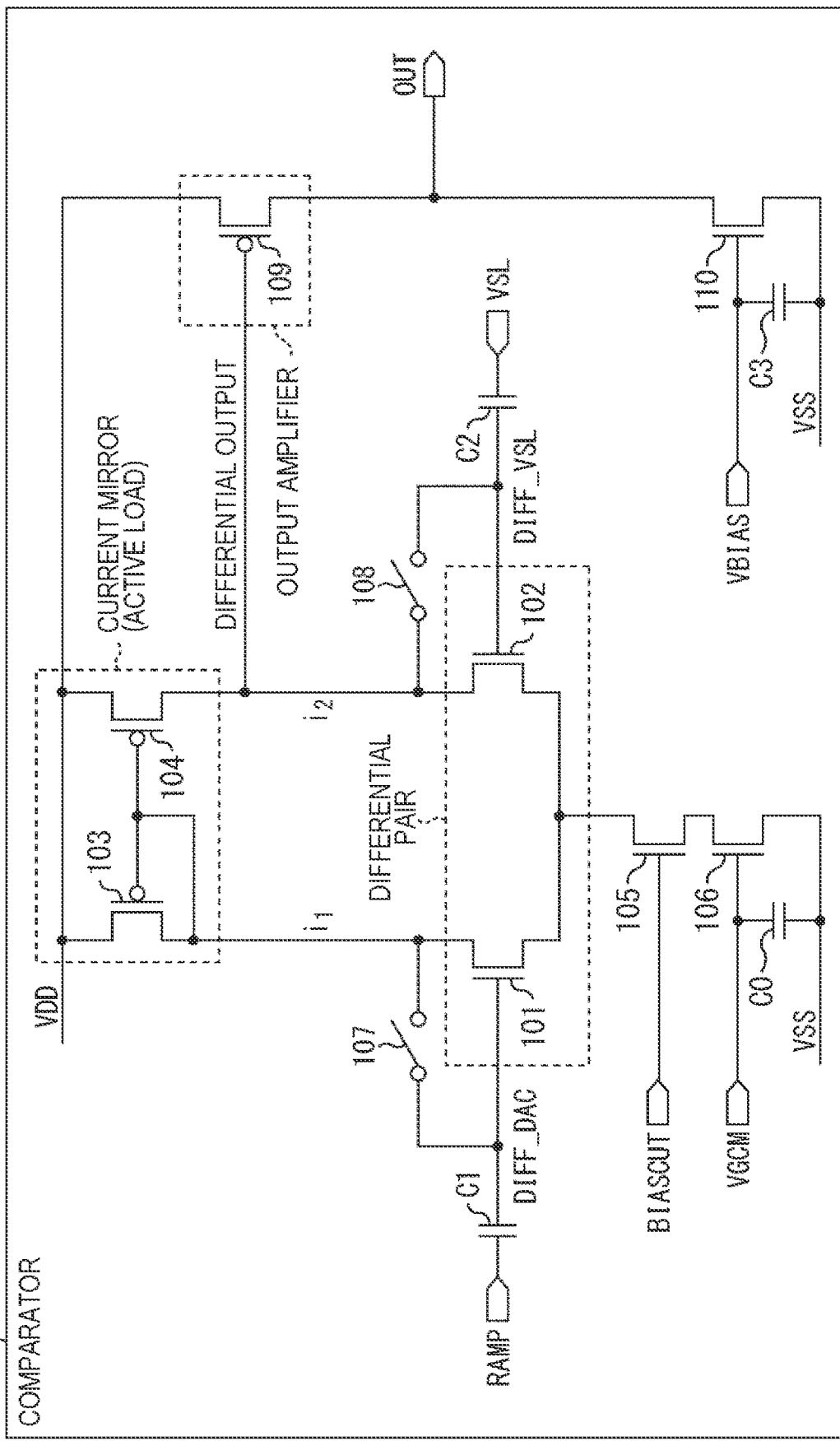
FIG. 5 is a circuit diagram illustrating a first exemplary configuration of a comparator $61_n$.

FIG. 5 is a circuit diagram illustrating a first exemplary configuration of a comparator $61_n$ in FIG. 4.

The comparator $61_n$ has an NMOS FET 101 and an NMOS FET 102, a positive channel MOS (PMOS) FET 103 and a PMOS FET 104, an NMOS FET 105 and an NMOS FET 106, a switch 107 and a switch 108, a PMOS FET 109, an NMOS FET 110, as well as capacitors C0, C1, C2, C3.

The FET 101 and the FET 102 configure a so-called differential pair, with the sources connected to each other. In addition, a node of the sources of the FET 101 and the FET 102 is connected to the drain of the FET 105.

The gate of the FET 101 is connected through the capacitor C1 to the inverting input terminal of the comparator $61_n$, in which to the gate of the FET 101, supplied is the RAMP signal as the reference signal, through the capacitor C1. The gate of the FET 102 is connected through the capacitor C2 to the non-inverting input terminal of the comparator $61_n$, in which to the gate of the FET 102, supplied is the VSL signal (pixel signal) output by the pixel $11_{m,n}$, through the capacitor C2.

As described above, the comparator $61_n$ has on the input stage thereof a differential pair that includes the FET 101 and the FET 102, and the gates of the FETs 101 and 102 as the input stage of the differential pair have provided thereto the capacitors C1 and C2 respectively.

The FET 103 and the FET 104 configure a current mirror which functions as an active load for the differential pair that includes the FETs 101 and 102. In the FET 103 and the FET 104, the gates are connected to each other, and the sources are connected to the power source (voltage) VDD (>0). The node of the gates of the FET 103 and the FET 104 is connected to the drain of the FET 103.

Out of the FET 103 and the FET 104 that configure the current mirror, the drain of the FET 103 is connected to the drain of the FET 101, and the drain of the FET 104 is connected to the drain of the FET 102.

Further, the node of the drains of the FET 102 and the FET 104 is connected to the gate of the FET 109, so that, a signal at the node of the drains of the FET 102 and the FET 104 is given to the FET 109 as an input signal for the FET 109.

Each of the switch 107 and the switch 108 is a switch that includes an FET or the like, for example, and is turned ON or OFF, in response to the auto-zero pulse supplied from the auto-zero control unit 32.

That is, the switch 107 turns ON or OFF in response to the auto-zero pulse, so as to connect or disconnect the gate of the FET 101, to or from the drain of the FET 101. The switch 108 turns ON or OFF in response to the auto-zero pulse, so as to connect or disconnect the gate of the FET 102, to or from the drain of the FET 102.

Now, the switch 107 and the switch 108 turn ON in the auto-zero operation. With the switch 107 and the switch 108 turned ON, the capacitors C1 and C2 are charged so as to equalize the gate voltage and the drain voltage in each of the FET 101 and the FET 102. According to the auto-zero operation, DIFF_DAC signal which is the RAMP signal supplied through the capacitor C1 to the gate of the FET 101, and DIFF_VSL signal which is the VSL signal supplied through the capacitor C2 to the gate of the FET 102, will therefore have the same voltage level.

Such voltage level of the DIFF_DAC signal and the DIFF_VSL signal equalized by the auto-zero operation, is understood to be the auto-zero potential which is the operating point potential of the comparator $61_n$.

As described previously, the drain of the FET 105 is connected to the node between the sources of the FET 101 and the FET 102 that configure the differential pair. In addition, the source of the FET 105 is connected to the drain of the FET 106, in which to the gate of the FET 105, supplied is a BIASCUT signal as a control signal elsewhere from an unillustrated circuit.

The gate and the source of the FET 106 are connected respectively to one end and the other end of the capacitor C0. To a node between the gate of the FET 106 and one end of the capacitor C0, supplied is a VGCM signal as a control signal elsewhere from an unillustrated circuit, and a node between the source of the FET 106 and the other end of the capacitor C0 is connected to a power source (voltage) VSS (<VDD). The FETs 105 and 106, as well as the capacitor C0 configure a current source.

The source of the FET 109 is connected to the power source VDD, meanwhile the drain is connected to the drain of the FET 110.

The gate and the source of the FET 110 are connected respectively to one end and the other end of the capacitor C3. To a node between the gate of the FET 110 and one end of the capacitor C3, supplied is a VBIAS signal as a control signal elsewhere from an unillustrated circuit, and a node between the source of the FET 110 and the other end of the capacitor C3 is connected to a power source VSS. The FETs 110 and the capacitor C3 configure a current source.

In thus configured comparator $61_n$, current $i_1$ corresponded to the DIFF_DAC signal as the gate voltage of the FET 101 flows through the FET 101 (from the drain to the source thereof), and, current $i_2$ corresponded to the DIFF_VSL as the gate voltage of the FET 102 flows through the FET 102 (from the drain to the source thereof).

In addition, through the FET 103 and the FET 104 (from the source to the drain thereof) that configure the current mirror, a current same as the current $i_1$ flowing through the FET 101 flows.

In a case where the DIFF_DAC signal as the gate voltage of the FET 101 is larger than the DIFF_VSL signal as the gate voltage of the FET 102, the current $i_1$ that flows through the FET 101 will become larger than the current $i_2$ that flows through the FET 102.

In this case, a current same as the current $i_1$ that flows through the FET 101 will flow through the FET 104 which configures the current mirror assuming, as a mirror source, the FET 103 connected to the FET 101, in which since the current $i_2$ that flows through the FET 102 connected to the FET 104 is smaller than the current $i_1$, so that the drain-source voltage of the FET 102 will increase so as to increase the current $i_2$.

Voltage at the node between the FET 102 and the FET 104 will consequently be brought to H level.

On the other hand, in a case where the DIFF_VSL signal as the gate voltage of the FET 102 is larger than the DIFF_DAC signal as the gate voltage of the FET 101, the current $i_2$ that flows through the FET 102 will become larger than the current $i_1$ that flows through the FET 101.

In this case, a current same as the current $i_1$ that flows through the FET 101 will flow through the FET 104 which configures the current mirror assuming, as a mirror source, the FET 103 connected to the FET 101, in which since the current $i_2$ that flows through the FET 102 connected to the FET 104 is larger than the current $i_1$, so that the drain-source voltage of the FET 102 will decrease so as to decrease the current $i_2$.

Voltage at the node between the FET 102 and the FET 104 will consequently be brought to L level.

The voltage at the node between the FET 102 and the FET 104, which is assumed as a differential output of a differential amplifier that includes the differential pair and the current mirror, is supplied to the gate of the FET 109 that configures an output amplifier for outputting an OUT signal which is an output signal of the comparator $61_n$.

The FET 110 outputs the OUT signal which is an output signal of the comparator $61_n$, corresponding to the differential output supplied to the gate thereof.

That is, in a case where the differential output is at H level, the FET 109 turns OFF, and outputs the OUT signal at L level. Meanwhile, in a case where the differential output is at L level, the FET 109 turns ON, and outputs the OUT signal at H level.

Considering the above, in a case where (voltage of) the RAMP signal as the reference signal is higher than (voltage of) the VSL signal, the OUT signal which is an output signal of the comparator $61_n$ becomes L level. On the other hand, in a case where the VSL signal is higher than the RAMP signal, the OUT signal which is an output signal of the comparator $61_n$ becomes H level.

By the thus configured comparator $61_n$, the auto-zero operation and comparison operation are carried out.

In the auto-zero operation, the switch 107 and the switch 108 turn ON.

With the switch 107 and the switch 108 turned ON, the gate and the drain of the FET 101 are connected, the gate and the drain of the FET 102 are connected, and the FET 101 and the FET 102 will have the same gate voltage.

The gate voltage of the FET 101 is given by the DIFF_DAC signal which is the RAMP signal supplied through the capacitor C1, and the gate voltage of the FET 102 is given by the DIFF_VSL signal which is the VSL signal supplied through the capacitor C2. In the auto-zero operation, the capacitors C1 and C2 are charged with electricity so as to equalize the DIFF_DAC signal and the DIFF_VSL signal.

The switch 107 and the switch 108 in the comparator $61_n$ then turn OFF, and the comparison operation then starts to compare the RAMP signal and the VSL signal supplied to the comparator $61_n$. With the switch 107 and the switch 108 turned OFF, the capacitors C1 and C2 maintain the electric charge accumulated while the switch 107 and the switch 108 are kept turned ON.

As a consequence, the comparator $61_n$ is set so as to equalize the RAMP signal as the DIFF_DAC signal and the VSL signal as the DIFF_VSL signal, having been given to the comparator $61_n$ while the switch 107 and the switch 108 are kept turned ON.

Such operation of setting the comparator $61_n$ is understood to be the auto-zero operation.

As a result of the auto-zero operation, the succeeding comparison operation can determine a level relation between the RAMP signal and the VSL signal, on the basis of agreement, in the comparator $61_n$, of the RAMP signal (voltage) and the VSL signal (voltage) having been given to the comparator $61_n$ during the auto-zero operation.

Figure 6:
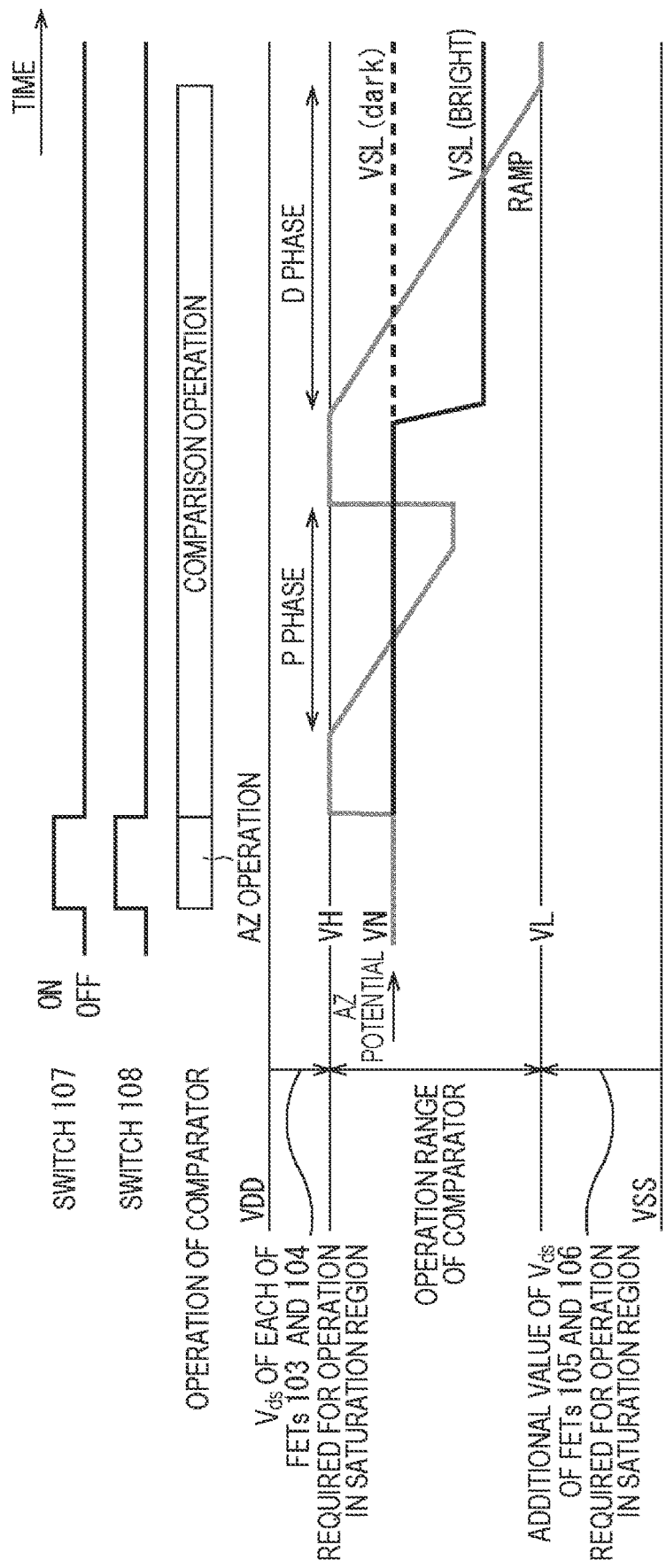
FIG. 6 is a timing chart explaining an exemplary operation of the first exemplary configuration of the comparator $61_n$.

FIG. 6 is a timing chart explaining an exemplary operation of the first exemplary configuration of the comparator $61_n$ in FIG. 5.

FIG. 6 illustrates ON/OFF of the switch 107 and the switch 108, operation of the comparator $61_n$, as well as the RAMP signal and the VSL signal.

Now, in AD conversion of the VSL signal, AD conversion of the reset-level VSL signal and AD conversion of the signal-level VSL signal take place, as has been explained referring to FIG. 3 and so forth.

In AD conversion of the VSL signal having been explained referring to FIG. 4, a length of time over which the RAMP signal, with a voltage slope decreasing or increasing at a constant rate, changes from the start of the slope up to a voltage that coincides with the VSL signal is counted, and the count value thus obtained by the counting is assumed to be a result of AD conversion of the VSL signal.

A sloping period of the RAMP signal during which the VSL signal at the reset level is subjected to AD conversion is referred to as preset (P) phase, and a sloping period of the RAMP signal during which the VSL signal at the signal level is subjected to AD conversion is referred to as data (D) phase. In this example, the AD conversion is predetermined to be carried out in the order of the P phase and the D phase. It is, however, also acceptable to carry out the AD conversion in the order of the D phase and the P phase.

In the comparator $61_n$, for example, the RAMP signal with the voltage decreased in the P phase and D phase is used, presupposing that the brighter the light incident on the pixel $11_{m,n}$ (the stronger the intensity of light) will be, the more largely the VSL signal (voltage) output from the pixel $11_{m,n}$ will decrease.

Now in FIG. 6 (the same will apply to drawings described later), the VSL signal in a case where light incident on the pixel $11_{m,n}$ is bright is given by a solid line, and the VSL signal in a dark case is given by a broken line.

In the comparator $61_n$, the switch 107 and the switch 108 during the auto-zero operation (AZ operation) are turned ON. Both of the DIFF_DAC signal as the RAMP signal and the DIFF_VSL signal as the VSL signal therefore come to have the auto-zero potential (AZ potential) VN.

The auto-zero potential VN is the gate voltage of the FET 101 (FET 102) with the switch 107 (switch 108) turned ON, and is therefore equal to the drain voltage of the FET 101 (FET 102). The auto-zero potential VN therefore equals to voltage given by VDD-Vgsp2, which represents subtraction of the gate-source voltage Vgsp2 of the FET 103 (FET 104) from the power source voltage VDD.

In the comparator $61_n$, the switch 107 and the switch 108 turn OFF after the auto-zero operation, and the comparison operation starts.

In the comparison operation, AD conversion of the VSL signal, that is AD conversion of the reset-level VSL signal and AD conversion of the signal-level VSL signal take place.

In the comparison operation, (the DIFF_DAC signal as) the RAMP signal is offset prior to start of the P phase, so as to be elevated by a predetermined voltage level, and is then allowed to descend at a constant rate in the P phase. A length of time ranging from the start of P phase, up to a point in time where the level relation between the (the DIFF_DAC signal as) the RAMP signal and (the DIFF_VSL signal as) the reset-level VSL signal will be inverted, is then counted, and a count value thus obtained by the counting is assumed to be a result of AD conversion of the reset-level VSL signal.

After the end of the P phase, the RAMP signal is offset so as to elevate the voltage up to a level at the start of the P phase, and then allowed to descend at a constant rate in the D phase. A length of time ranging from the start of D phase, up to a point in time where the level relation between the RAMP signal and signal-level VSL signal will be inverted, is then counted, and a count value thus obtained by the counting is assumed to be a result of AD conversion of the signal-level VSL signal.

Since it is presupposed now that the brighter the light incident on the pixel $11_{m,n}$ will be, the more largely the VSL signal output from the pixel $11_{m,n}$ will decrease, so that if the light incident on the pixel $11_{m,n}$ in the D phase is bright, the signal-level VSL signal will largely decrease as indicated by a solid line in FIG. 6, whereas if the light incident on the pixel $11_{m,n}$ is dark, the signal-level VSL signal will not so largely decrease as indicated by a broken line in FIG. 6.

As described above, the RAMP signal employed here is a signal with the level lowered (descending) with time in the P phase and D phase, presupposing that the brighter the light incident on the pixel $11_{m,n}$ will be, the lower the VSL signal output from the pixel $11_{m,n}$ will be.

Now, the aforementioned change of the VSL signal such as decreasing the level as the light incident on the pixel $11_{m,n}$ becomes brighter, and, the change of the RAMP signal such as lowered (decreasing) with time in the P phase and the D phase, are also referred to as normal change.

The comparator $61_n$ according to the first exemplary configuration illustrated in FIG. 5 is designed, presupposing that the VSL signal and the RAMP signal are subject to the normal change.

Assuming now that a voltage, which is lower than the power source voltage VDD, by the drain-source voltage $V_{ds}$ of the FET 103 and the FET 104 required by the FET 103 and the FET 104 to operate in the saturation region, will be referred to as voltage VH. Meanwhile, a voltage higher than the power source voltage VSS, by an additional value of the drain-source voltage $V_{ds}$ of the FET 105 and the drain-source voltage $V_{ds}$ of the FET 106 required by the FET 105 and the FET 106 to operate in the saturation region, will be referred to as voltage VL (>VH).

The comparator $61_n$ is designed, while assuming a range not lower than the voltage VL and not higher than the voltage VH as the operation range of the comparator $61_n$, so that (the DIFF_DAC signal as) the RAMP signal and (the DIFF_VSL signal as) the VSL signal subject to the normal change in normal operation will fall within the operation range of the comparator $61_n$.

Considering now that if any novel pixel with the VSL signal (pixel signal) ascendable as the incident light becomes brighter, contrary to the normal change, were developed, there might be a case where the RAMP signal ascendable with the elapse of time during the P phase and the D phase, contrary to the normal change, would be suitable for such pixel.

In addition, for such novel pixel, whether the RAMP signal subject to the normal change would be suitable, or whether the RAMP signal that ascends with time in the P phase and the D phase, contrary to the normal change, would be suitable, might remain unclear unless the pixel is actually tested and evaluated.

Now, changes of the VSL signal and the RAMP signal contrary to the normal change, that is, a change of the VSL signal that ascends as the light incident on the pixel $11_{m,n}$ becomes brighter, and, a change of the RAMP signal that ascends with time in the P phase and the D phase, are also referred to as inversion change.

Figure 7:
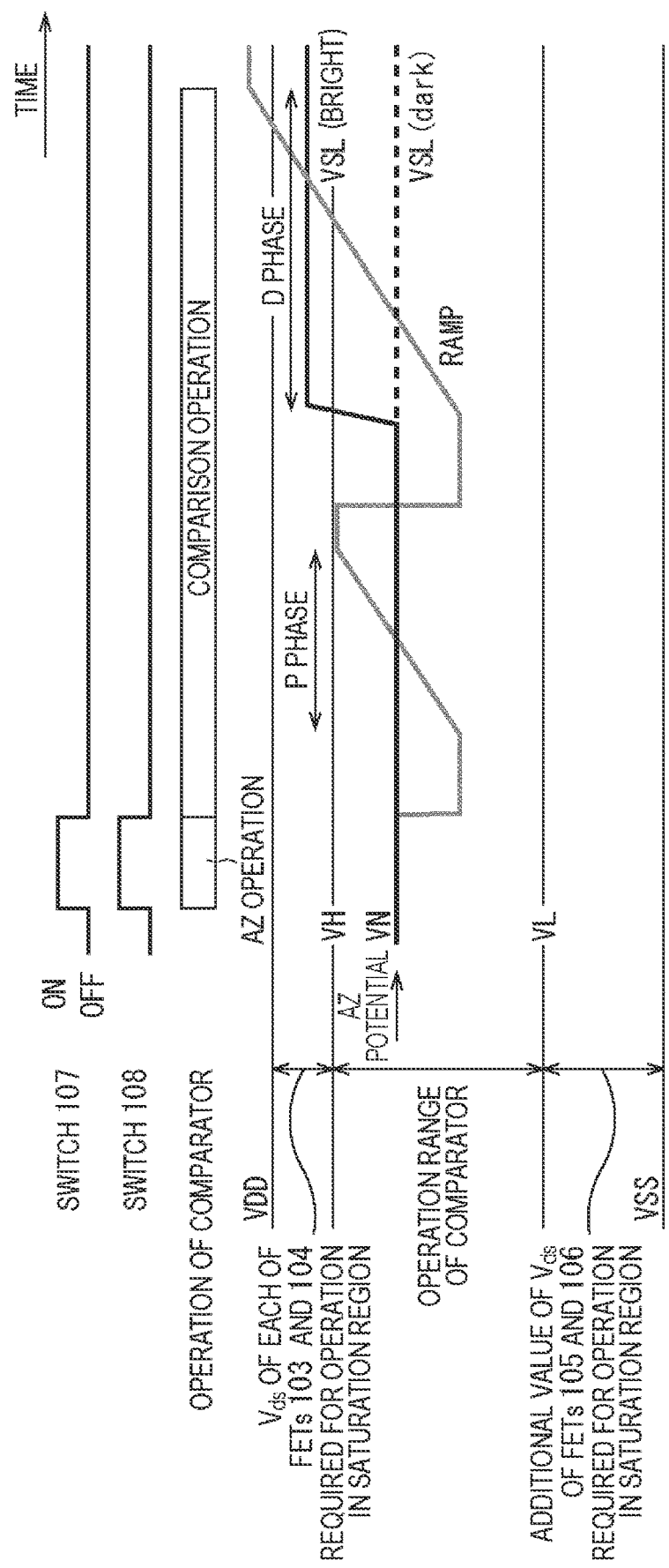
FIG. 7 is a timing chart explaining an exemplary operation of the first exemplary configuration of the comparator $61_n$, in a case where a RAMP signal and a VSL signal are subject to inversion change.

FIG. 7 is a timing chart explaining an exemplary operation of the first exemplary configuration of the comparator $61_n$, in a case where a RAMP signal and a VSL signal are subject to inversion change.

FIG. 7 illustrates, similarly to FIG. 6, ON/OFF of the switch 107 and the switch 108, operation of the comparator $61_n$, as well as the RAMP signal and the VSL signal.

FIG. 7 is different from FIG. 6, in that the RAMP signal and the VSL signal are subject to the inversion change, rather than the normal change.

In the comparator $61_n$, the switch 107 and the switch 108 during the auto-zero operation (AZ operation) are turned ON. Both of the DIFF_DAC signal as the RAMP signal and the DIFF_VSL signal as the VSL signal therefore come to have the auto-zero potential (AZ potential) VN.

As has been explained referring to FIG. 6, the auto-zero potential VN is a voltage represented by VDD-Vgsp2, which represents subtraction of the gate-source voltage Vgsp2 of the FET 103, from the power source voltage VDD.

In the comparator $61_n$, the switch 107 and the switch 108 turn OFF after the auto-zero operation, and the comparison operation starts.

In the comparison operation, AD conversion of the VSL signal, that is AD conversion of the reset-level VSL signal and AD conversion of the signal-level VSL signal take place.

In a case where the RAMP signal that is subject to the inversion change is used, the RAMP signal in the comparison operation is offset, prior to the start of P phase, so as to be lowered by a predetermined voltage, and then allowed to ascend in the P phase at a constant rate. A length of time ranging from the start of P phase, up to a point in time where the level relation between the RAMP signal and the reset-level VSL signal will be inverted, is then counted, and a count value thus obtained by the counting is assumed to be a result of AD conversion of the reset-level VSL signal.

After the end of the P phase, the RAMP signal is offset so as to descend the voltage to a level at the start of the P phase, and then allowed to ascend at a constant rate in the D phase. A length of time ranging from the start of D phase, up to a point in time where the level relation between the RAMP signal and signal-level VSL signal will be inverted, is then counted, and a count value thus obtained by the counting is assumed to be a result of AD conversion of the signal-level VSL signal.

Since the VSL signal in FIG. 7 is subject to the inversion change, so that if the light incident on the pixel $11_{m,n}$ in the D phase is bright, the signal-level VSL signal will largely ascend as indicated by a solid line in FIG. 7, meanwhile if the light incident on the pixel $11_{m,n}$ is dark, the signal-level VSL signal will not so largely ascend as indicated by a broken line in FIG. 7.

In the first exemplary configuration of the comparator $61_n$, the auto-zero potential remains unchanged at voltage (potential) VN, irrespective of cases in that the RAMP signal and the VSL signal will be subject to the normal change or will be subject to the inversion change. In a case where the auto-zero potential is equal to the voltage VN, and the RAMP signal and the VSL signal are subject to the normal change, the RAMP signal and the VSL signal will fall within the operation range of the comparator $61_n$ which is not lower than the voltage VL and not higher than the voltage VH, as illustrated in FIG. 6. However, in a case where the auto-zero potential equals to the voltage VN, and the RAMP signal and the VSL signal are subject to the inversion change, the RAMP signal and VSL signal would not fall within the operation range of the comparator $61_n$ which is not lower than the voltage VL and not higher than the voltage VH, as illustrated in FIG. 7, and would exceed the voltage VH.

If the RAMP signal or the VSL signal should exceed the voltage VH, the FET 103 and the FET 104 can no more operate in the saturation region, degrading linearity of the AD conversion.

Therefore, Patent Document 1 describes a technology of modifying the auto-zero potential, by allowing an externally applied voltage generation circuit that is provided outside of the comparator to generate an externally applied voltage, and then by feeding the externally applied voltage to the comparator.

Such case of generating the externally applied voltage in the externally applied voltage generation circuit outside of the comparator, and of supplying it to the comparator, however, needs provision of the externally applied voltage generation circuit outside of the comparator. In addition, in an exemplary case where the externally applied voltage generation circuit is provided outside of a chip that serves as a CMOS image sensor, also required is an external input terminal through which the externally applied voltage generated by the externally applied voltage generation circuit is supplied to the comparator, besides the externally applied voltage generation circuit.

Now the description below will explain a comparator that can easily modify the auto-zero potential of the comparator, that is, for example a comparator with a simple configuration, which can easily modify the auto-zero potential without providing the externally applied voltage generation circuit.

<Second Exemplary Configuration of Comparator $61_n$>

Figure 8:
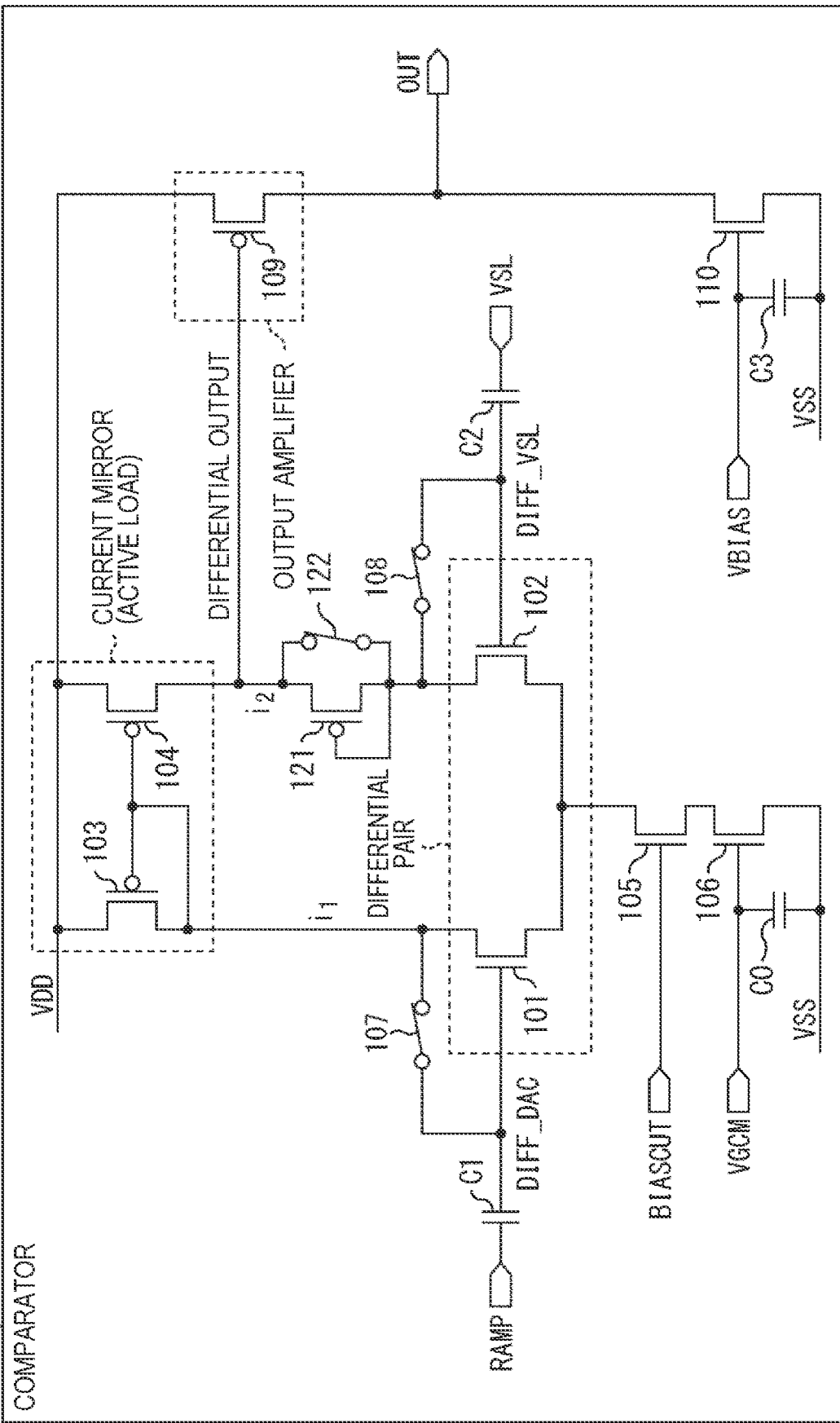
FIG. 8 is a circuit diagram illustrating a second exemplary configuration of a comparator $61_n$.

FIG. 8 is a circuit diagram illustrating a second exemplary configuration of a comparator $61_n$ in FIG. 4.

Note that all parts in FIG. 8, corresponded to those in FIG. 5, are given same reference signs, so that explanation therefor will be properly skipped in the description below.

The comparator $61_n$ in FIG. 8 has the FET 101 to FET 110, the capacitors C0 to C3, a PMOS FET 121, and, the switch 122.

The comparator $61_n$ in FIG. 8 therefore has the FET 101 to FET 110 and the capacitors C0 to C3, in common with the case illustrated in FIG. 5. The comparator $61_n$ in FIG. 8 is, however, different from the case illustrated in FIG. 5, in that the FET 121 and the switch 122 are newly provided.

The FET 121 is connected between the FET 102 that configures the differential pair, and the FET 104 that configures the current mirror. That is, the drain of the FET 121 is connected to the drain of the FET 102, and the source of the FET 121 is connected to the drain of the FET 104. In addition, the gate of the FET 121 is connected to the drain of the FET 121. That is, the FET 121 is diode-connected, and functions as a voltage drop mechanism that causes a predetermined voltage drop between the FET 102 and the FET 104.

Note that, although this embodiment employs a transistor such as diode-connected FET or the like, as the voltage drop mechanism that causes a predetermined voltage drop, any freely selectable mechanism capable of causing a predetermined voltage drop, such as diode or resistor, may alternatively be employed as the voltage drop mechanism, for example.

The switch 122 typically includes an FET or the like, and is connected in parallel to the diode-connected FET 121 as the voltage drop mechanism. That is, the switch 122 is connected between the FET 102 that configures the differential pair, and the FET 104 that configures the current mirror, bypassing the FET 121.

Note that, in FIG. 8, the differential output which is voltage at the node between the FET 102 and the FET 104 is supplied to the gate of the FET 109 that configures an output amplifier for outputting the OUT signal as an output signal of the comparator $61_n$, similarly to the case illustrated in FIG. 6.

Therefore in the comparator $61_n$, (the drain of) the FET 102 to which the VSL signal is input is connected to (the gate) of the FET 109 that configures the output amplifier.

Now, to the FET 109 that configures the output amplifier, connectable is (the drain) of the FET 101, out of the FET 101 and the FET 102 that configure the differential pair, rather than the FET 102.

Note however that the gate of the FET 101 has connected thereto a reference signal line 33A (FIG. 4) through which the RAMP signal is input, and the reference signal line 33A is connected to each of the pixels $11_{m,1}$ to pixel $11_{m,N}$ arranged in a row. In a case where the FET 101 is connected to the FET 109, an effect of the FET 109 of the comparator $61_n$ that processes the VSL signal (pixel signal) of a certain pixel $11_{m,n}$ may propagate through the reference signal line 33A to reach a pixel $11_{m,n-1}$ and a pixel $11_{m,n+1}$ neighboring the pixel $11_{m,n}$. Connection of the FET 101, with the reference signal line 33A connected thereto, to the FET 109 will therefore cause streaking. The streaking is an event in which, for example, light of a light source or the like when shot is seen so as to be laterally spread like a band.

Therefore as illustrated in FIG. 8, the FET 109 may have connected thereto the FET 102 to which the reference signal line 33A is not connected, out of the FET 101 and the FET 102 that configure the differential pair.

By connecting the FET 102 to the FET 109, the streaking may be suppressed.

Note that, with the FET 102 connected to the FET 109, the FET 109 now can be started to operate from a position away as possible from the linear region in the saturation region, for both cases where the VSL signal and the RAMP signal are subject to the normal change, and to the inversion change. This contributes to operational stability of the comparator $61_n$.

In addition, the FET 121 and the switch 122 in FIG. 8 are connected between the FET 102 to which the VSL signal is input, out of the FET 101 and the FET 102 that configure the differential pair, and the FET 104 as a mirroring destination, out of the FET 103 and the FET 104 that configure the current mirror. Note that, the FET 121 and the switch 122 may alternatively be connected between the FET 101 to which the RAMP signal is input, out of the FET 101 and the FET 102 that configure the differential pair, and the FET 103 as a mirroring source, out of the FET 103 and the FET 104 that configure the current mirror, rather than between the FET 102 and the FET 104.

In a case where the VSL signal and the RAMP signal are subject to the normal change in the thus configured comparator $61_n$, and during the auto-zero operation, the switch 107 and the switch 108, as well as the switch 122 turn ON, as illustrated in FIG. 8. With the switch 122 turned ON, the FET 102 and the FET 104 are as it were connected in series, bypassing the diode-connected FET 121.

Figure 9:
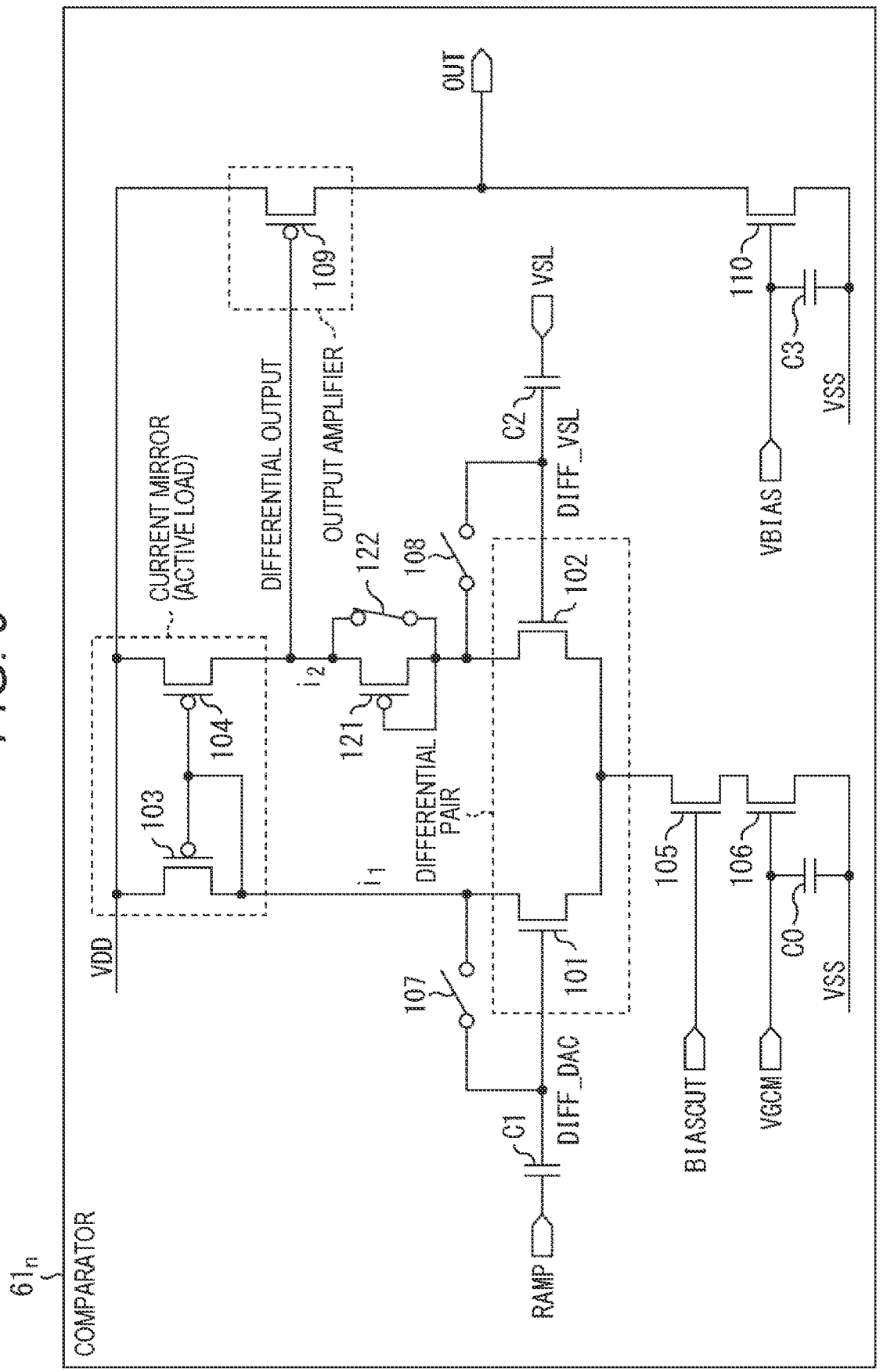
FIG. 9 is a drawing illustrating states of a switch 107 and a switch 108, as well as a switch 122 in a second exemplary configuration of the comparator $61_n$, during comparison operation in a case where the VSL signal and the RAMP signal are subject to normal change.

FIG. 9 is a drawing illustrating states of a switch 107 and a switch 108, as well as a switch 122 in a second exemplary configuration of the comparator $61_n$ in FIG. 8, during comparison operation where the VSL signal and the RAMP signal are subject to normal change.

In a case where the VSL signal and the RAMP signal are subject to the normal change in the second exemplary configuration of the comparator $61_n$ illustrated in FIG. 8, and during the comparison operation, the switch 107 and the switch 108 turn OFF, and the switch 122 turns ON, as illustrated in FIG. 9. Accordingly, in a case where the VSL signal and the RAMP signal are subject to the normal change, the switch 122 will remain normally-ON.

Figure 10:
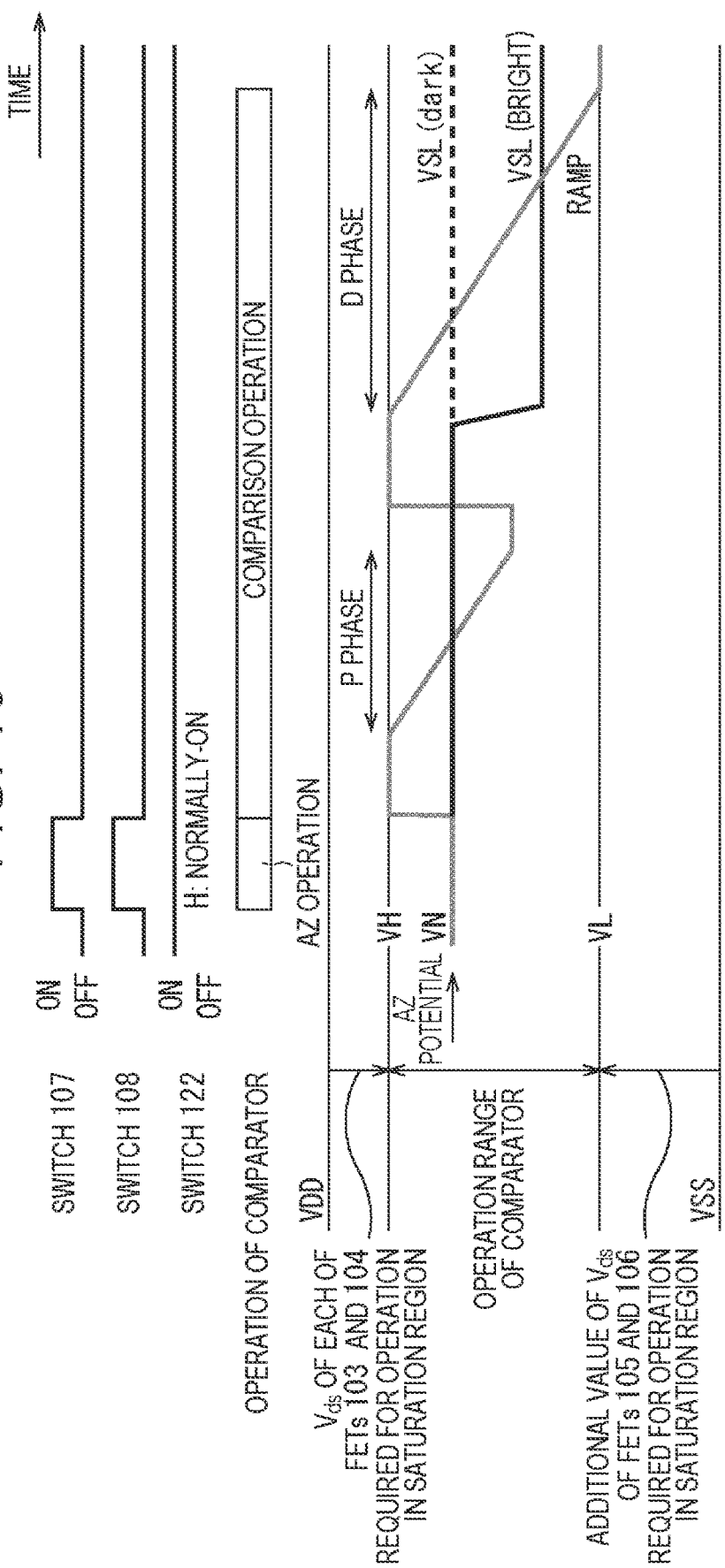
FIG. 10 is a timing chart illustrating an exemplary operation of the second exemplary configuration of the comparator $61_n$ in a case where the RAMP signal and the VSL signal are subject to normal change.

FIG. 10 is a timing chart illustrating an exemplary operation of the second exemplary configuration of the comparator $61_n$ in a case where the RAMP signal and the VSL signal are subject to the normal change.

FIG. 10 illustrates ON/OFF states of the switch 107 and the switch 108, operation of the comparator $61_n$, as well as the RAMP signal and the VSL signal, similarly to the case illustrated in FIG. 6. FIG. 10 further illustrates an ON/OFF state of the switch 122.

In a case where the RAMP signal and the VSL signal are subject to the normal change, the switch 122 remains normally-ON. Therefore in the second exemplary configuration of the comparator $61_n$ illustrated in FIG. 8, the FET 102 and the FET 104 are connected through the switch 122. That is, assuming there is no voltage drop in the switch 122 for simplicity of explanation, the FET 102 and the FET 104 are now considered to be directly connected, similarly to the first exemplary configuration of the comparator $61_n$ illustrated in FIG. 5.

The second exemplary configuration of the comparator $61_n$ illustrated in FIG. 8 therefore operates, similarly to the first exemplary configuration of the comparator $61_n$ illustrated in FIG. 5.

That is, in the comparator $61_n$, the switch 107 and the switch 108 during the auto-zero operation (AZ operation) are turned ON. Both of the DIFF_DAC signal as the RAMP signal and the DIFF_VSL signal as the VSL signal therefore come to have the auto-zero potential (AZ potential) VN.

Similarly to the case illustrated in FIG. 5, the auto-zero potential VN is a voltage represented by VDD-Vgsp2, which represents subtraction of the gate-source voltage Vgsp2 of the FET 103, from the power source voltage VDD.

In the comparator $61_n$, the switch 107 and the switch 108 turn OFF after the auto-zero operation, and the comparison operation starts.

In the comparison operation, AD conversion of the VSL signal, that is AD conversion of the reset-level VSL signal and AD conversion of the signal-level VSL signal take place.

In a case where the RAMP signal that is subject to the normal change is used, the RAMP signal in the comparison operation is offset, prior to the start of P phase, so as to ascend by a predetermined voltage, and then allowed to be lowered in the P phase at a constant rate. A length of time ranging from the start of P phase, up to a point in time where the level relation between the RAMP signal and the reset-level VSL signal will be inverted, is then counted, and a count value thus obtained by the counting is assumed to be a result of AD conversion of the reset-level VSL signal.

After the end of the P phase, the RAMP signal is offset so as to elevate the voltage up to a level at the start of the P phase, and then allowed to descend at a constant rate in the D phase. A length of time ranging from the start of D phase, up to a point in time where the level relation between the RAMP signal and signal-level VSL signal will be inverted, is then counted, and a count value thus obtained by the counting is assumed to be a result of AD conversion of the signal-level VSL signal.

Note that, in FIG. 10, the VSL signal indicated by a solid line represents the VSL signal obtained in a case where the light incident on the pixel $11_{m,n}$ is bright, meanwhile the VSL signal indicated by a broken line represents the VSL signal obtained in a case where the light incident on the pixel $11_{m,n}$ is dark, similarly to the case in FIG. 6.

Since the VSL signal and the RAMP signal in FIG. 10 are subject to the normal change, similarly to the case illustrated in FIG. 6, referring to the auto-zero potential given by voltage VN=VDD-Vgsp2, so that the RAMP signal and the VSL signal thus causing the normal change will fall within the operation range of the comparator $61_n$.

Figure 11:
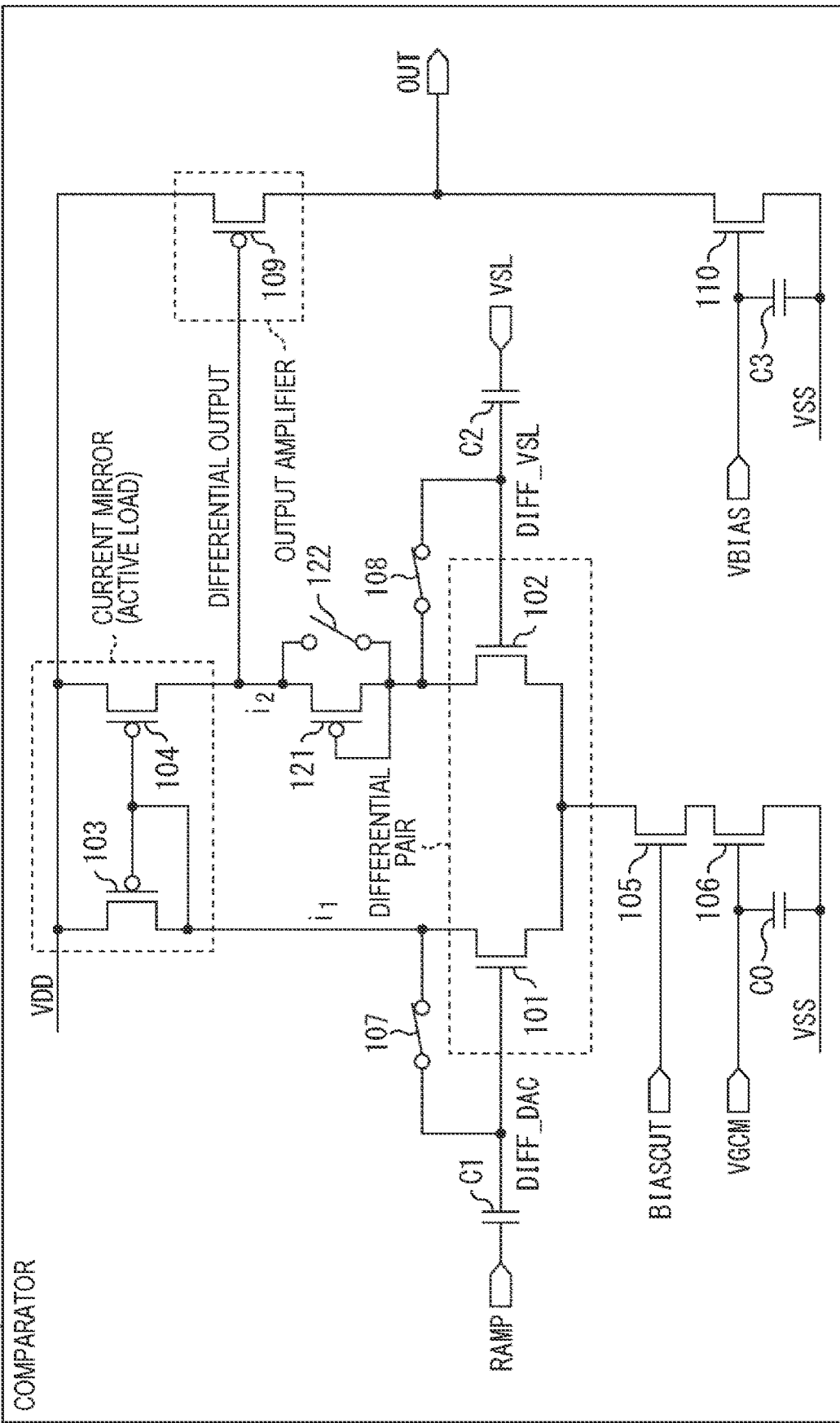
FIG. 11 is a drawing illustrating states of the switch 107 and the switch 108, as well as the switch 122 in the second exemplary configuration of the comparator $61_n$, during auto-zero operation in a case where the VSL signal and the RAMP signal are subject to inversion change.

FIG. 11 is a drawing illustrating states of the switch 107 and the switch 108, as well as the switch 122 in the second exemplary configuration of the comparator $61_n$ in FIG. 8, during auto-zero operation where the VSL signal and the RAMP signal are subject to inversion change.

In a case where the VSL signal and the RAMP signal are subject to the inversion change during the auto-zero operation in the second exemplary configuration of the comparator $61_n$ illustrated in FIG. 8, the switch 107 and the switch 108 turn ON, and the switch 122 turns OFF, as illustrated in FIG. 11.

With the switch 122 turned OFF, the FET 102 and the FET 104 are connected through the diode-connected FET 121. As a consequence, voltage drop just equivalent to the gate-source voltage Vgsp3 of the FET 121 occurs at the diode-connected FET 121, between the FET 102 and the FET 104.

Thus, the auto-zero potential in a case where the VSL signal and the RAMP signal are subject to the inversion change is given by VN-Vgsp3=VDD-Vgsp2-Vgsp3, which represents that the auto-zero potential, in a case where the VSL signal and the RAMP signal are subject to the inversion change, is smaller than the voltage VN, which is the auto-zero potential, in a case where the VLS signal and the RAMP signal are subject to the normal change, just by the gate-source voltage Vgsp3 of the FET 121.

In the second exemplary configuration of the comparator $61_n$ illustrated in FIG. 8, the switch 107 and the switch 108 turn OFF, and the switch 122 turns ON after the auto-zero operation as illustrated in FIG. 9, to start the comparison operation.

Figure 12:
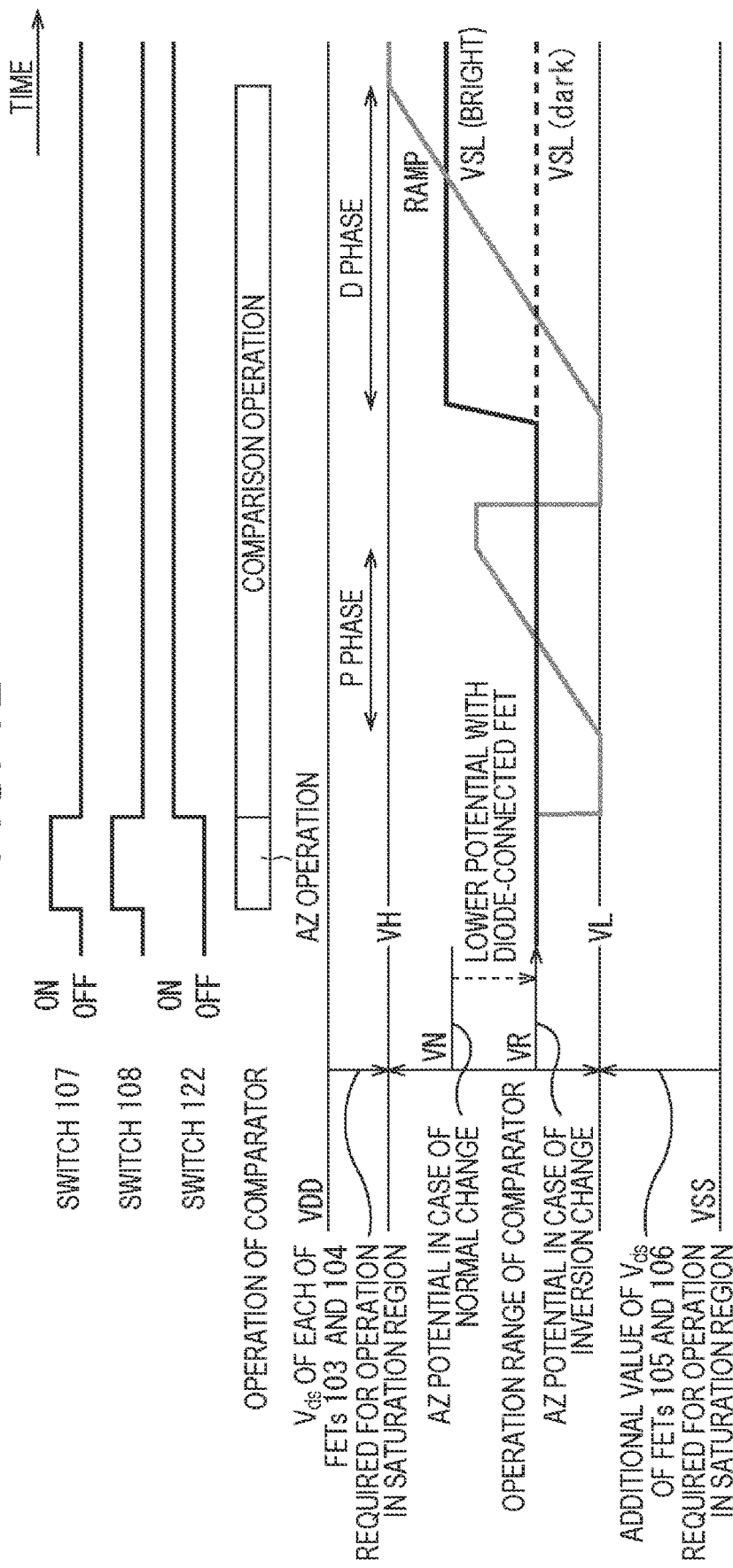
FIG. 12 is a timing chart illustrating an exemplary operation of the second exemplary configuration of the comparator $61_n$ in a case where the RAMP signal and the VSL signal are subject to inversion change.

FIG. 12 is a timing chart illustrating an exemplary operation of the second exemplary configuration of the comparator $61_n$ in a case where the RAMP signal and the VSL signal are subject to inversion change.

FIG. 12 illustrates ON/OFF states of the switch 107 and the switch 108, operation of the comparator $61_n$, as well as the RAMP signal and the VSL signal, similarly to the case illustrated in FIG. 6. FIG. 12 further illustrates an ON/OFF state of the switch 122.

The case in FIG. 12 is different from the case in FIG. 10, in that the RAMP signal and the VSL signal are subject to the inversion change, rather than to the normal change. The case in FIG. 12 is further different from the case in FIG. 10, in that the switch 122 turns OFF during the auto-zero operation, and, that the auto-zero potential is given by voltage VR which is lower, by the gate-source voltage Vgsp3 of the diode-connected FET 121, than the auto-zero potential VN given in a case where the RAMP signal and the VSL signal are subject to the normal change.

In the comparator $61_n$, the switch 107 and the switch 108 during the auto-zero operation (AZ operation) are turned ON, as well as the switch 122 is turned OFF. Both of the DIFF_DAC signal as the RAMP signal and the DIFF_VSL signal as the VSL signal therefore come to have the auto-zero potential (AZ potential) VR.

As has been explained referring to FIG. 11, with the switch 122 turned OFF in a case where the RAMP signal and the VSL signal are subject to the inversion change, the voltage drop just equivalent to the gate-source voltage Vgsp3 of the FET 121 occurs at the diode-connected FET 121, between the FET 102 and the FET 104. As a result, the auto-zero potential VR in a case where the RAMP signal and the VSL signal are subject to the inversion change is given by VN-Vgsp3=VDD-Vgsp2-Vgsp3, which represents that the auto-zero potential, in a case where the VSL signal and the RAMP signal are subject to the inversion change, is smaller than the voltage VN, which is the auto-zero potential, in a case where the VLS signal and the RAMP signal are subject to the normal change, just by the gate-source voltage Vgsp3 of the FET 121.

In the comparator $61_n$, the switch 107 and the switch 108 turn OFF, and the switch 122 turns ON after the auto-zero operation, to start the comparison operation.

In the comparison operation, AD conversion of the VSL signal, that is AD conversion of the reset-level VSL signal and AD conversion of the signal-level VSL signal take place.

In a case where the RAMP signal that is subject to the inversion change is used, the RAMP signal in the comparison operation is offset, prior to the start of P phase, so as to be lowered by a predetermined voltage, and then allowed to ascend in the P phase at a constant rate. A length of time ranging from the start of P phase, up to a point in time where the level relation between the RAMP signal and the reset-level VSL signal will be inverted, is then counted, and a count value thus obtained by the counting is assumed to be a result of AD conversion of the reset-level VSL signal.

After the end of the P phase, the RAMP signal is offset so as to descend the voltage to a level at the start of the P phase, and then allowed to ascend at a constant rate in the D phase. A length of time ranging from the start of D phase, up to a point in time where the level relation between the RAMP signal and signal-level VSL signal will be inverted, is then counted, and a count value thus obtained by the counting is assumed to be a result of AD conversion of the signal-level VSL signal.

Note that, in FIG. 12, the VSL signal indicated by a solid line represents the VSL signal obtained in a case where the light incident on the pixel $11_{m,n}$ is bright, meanwhile the VSL signal indicated by a broken line represents the VSL signal obtained in a case where the light incident on the pixel $11_{m,n}$ is dark, similarly to the case in FIG. 7.

Since the VSL signal and the RAMP signal in FIG. 12 are subject to the inversion change, referring to voltage VR=VN-Vgsp3 which is lower, just by the gate-source voltage Vgsp3 of the FET 121, than the auto-zero potential VN illustrated in FIG. 6 and FIG. 7, so that the RAMP signal and the VSL signal thus being subjected to the inversion change can be fallen within the operation range of the comparator $61_n$.

It becomes therefore possible to prevent the RAMP signal and the VSL signal subjected to the inversion change from exceeding the operation range of the comparator $61_n$ which is not lower than the voltage VL and not higher than the voltage VH, and from surpassing the voltage VH as illustrated in FIG. 7, and therefore it becomes possible to prevent the linearity of AD conversion from degrading.

As described above, with the second exemplary configuration of the comparator $61_n$ illustrated in FIG. 8, the auto-zero potential may be easily modified only by turning ON/OFF the switch 122, with the aid of a simple configuration having added thereto the diode-connected FET 121 as the voltage drop mechanism, and the switch 122.

The AD conversion may therefore be carried out while keeping the linearity, for both cases where the RAMP signal and the VSL signal are subject to the normal change, and to the inversion change.

In addition, according to the second exemplary configuration of the comparator $61_n$ illustrated in FIG. 8, there is no need of providing an externally applied voltage generation circuit, or an external input terminal through which externally applied voltage generated by the externally applied voltage generation circuit is supplied to the comparator, unlike the technology described in Patent Document 1 for the purpose of modifying the auto-zero potential. A chip as the image sensor 2 can therefore be suppressed from being upsized to cope with modification of the auto-zero potential.

In addition in the second exemplary configuration of the comparator $61_n$ illustrated in FIG. 8, the FET 102, to which the reference signal line 33A is not connected (the RAMP signal is not input), out of the FET 101 and the FET 102 that configure the differential pair, is connected to the FET 109 that configures the output amplifier, in both cases where the RAMP signal and the VSL signal are subject to the normal change and to the inversion change, making it possible to suppress streaking caused by any effect of the FET 109 propagated through the reference signal line 33A.

<Third Exemplary Configuration of Comparator $61_n$>

Figure 13:
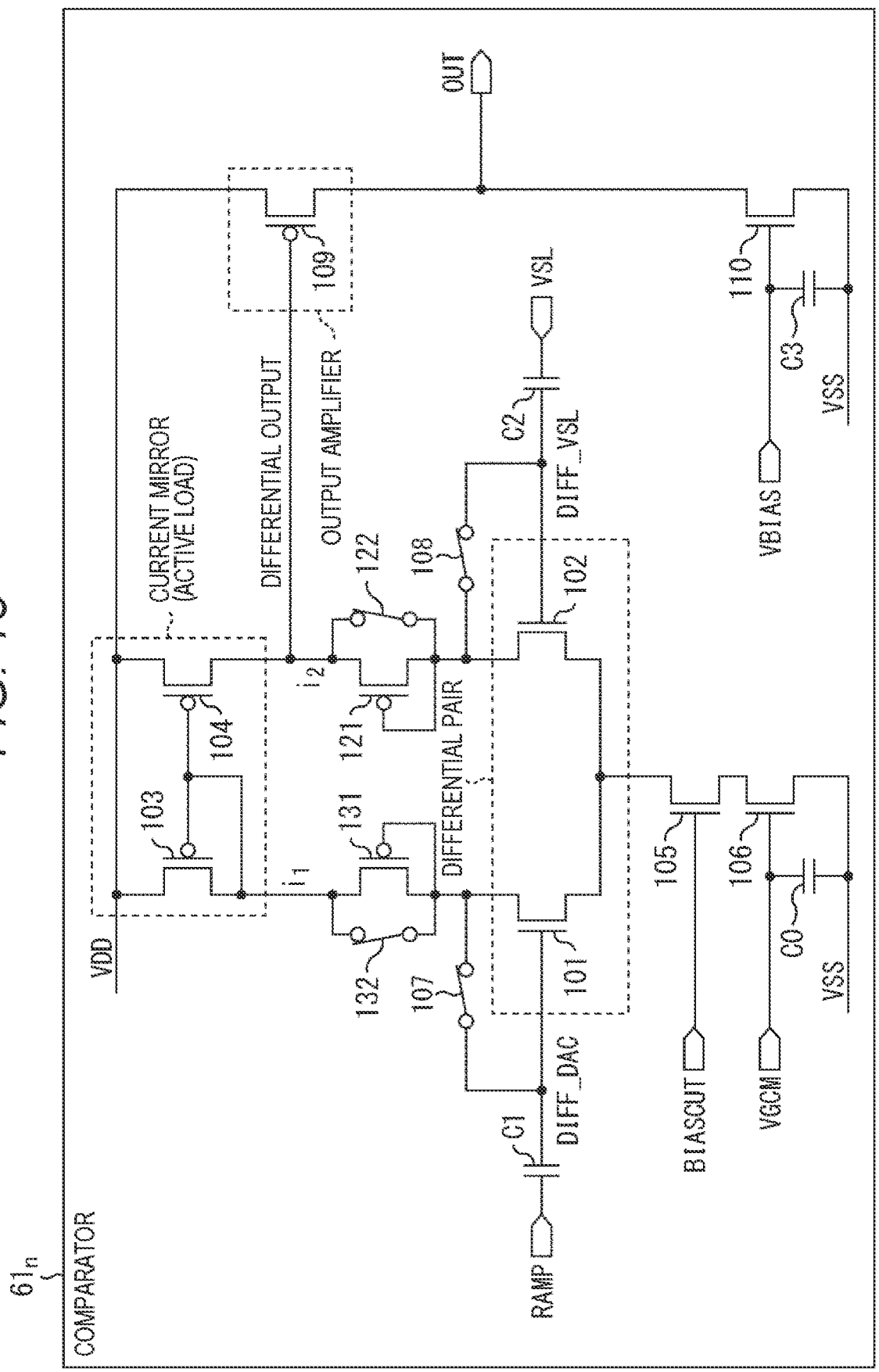
FIG. 13 is a circuit diagram illustrating a third exemplary configuration of a comparator $61_n$.

FIG. 13 is a circuit diagram illustrating a third exemplary configuration of a comparator $61_n$ in FIG. 4.

Note that all parts in FIG. 13, corresponded to those in FIG. 8, are given same reference signs, so that explanation therefor will be properly skipped in the description below.

The comparator $61_n$ in FIG. 13 has the FET 101 to FET 110, the capacitors C0 to C3, the FET 121, the switch 122, a PMOS FET 131, and, the switch 132.

The comparator $61_n$ in FIG. 13 therefore has the FET 101 to FET 110, the capacitors C0 to C3, the FET 121, and the switch 122 in common with the case illustrated in FIG. 8. The comparator $61_n$ in FIG. 13 is, however, different from the case illustrated in FIG. 8, in that the FET 131 and the switch 132 are newly provided.

Now in the second exemplary configuration of the comparator $61_n$ illustrated in FIG. 8, the FET 121 and the switch 122 are provided between the FET 102 which is one of the FET 101 and the FET 102 that configure the differential pair, and the FET 104 which is one of the FET 103 and the FET 104 that configure the current mirror. Note however there is no circuit equivalent to the FET 121 and the switch 122, provided between the FET 101 which is the other one of the FET 101 and the FET 102 that configure the differential pair, and the FET 103 which is the other one of the FET 103 and the FET 104 that configure the current mirror. Therefore in the second exemplary configuration of the comparator $61_n$ illustrated in FIG. 8, the differential pair that includes the current mirror and the differential amplifier is, in other words, not bilaterally symmetrical.

In a case where the differential amplifier is not bilaterally symmetrical as described above, the comparator $61_n$ is anticipated to result in unbalanced operation, for example, between the cases where the RAMP signal and the VSL signal are subject to the normal change and to the inversion change.

Now, in a third exemplary configuration of the comparator $61_n$ illustrated in FIG. 13, the differential amplifier that includes the differential pair and the current mirror is made bilaterally symmetrical, by providing the FET 131 and the switch 132 which configure a circuit equivalent to the FET 121 and the switch 122, between the FET 101 and the FET 103 in the second exemplary configuration of the comparator $61_n$ illustrated in FIG. 8.

That is, in FIG. 13, the FET 131 is connected between the FET 101 that configures the differential pair, and the FET 103 that configures the current mirror. Specifically, the drain of the FET 131 is connected to the drain of the FET 101, and the source of the FET 131 is connected to the drain of the FET 103. In addition, the gate of the FET 131 is connected to the drain of the FET 131. That is, the FET 131 is diode-connected similarly to the FET 121, and functions as a voltage drop mechanism that causes a predetermined voltage drop between the FET 101 and the FET 103.

The switch 132 includes, for example, an FET or the like, and is connected in parallel to the diode-connected FET 131 as the voltage drop mechanism. That is, the switch 132 is connected between the FET 101 that configures the differential pair, and the FET 103 that configures the current mirror, bypassing the FET 131.

Note that, also in FIG. 13, the FET 109 is ensured to suppress streaking and so forth, as a result of connection with the FET 102 similarly to the case illustrated in FIG. 8.

In a case where the VSL signal and the RAMP signal are subject to the normal change in the thus configured comparator $61_n$, and during the auto-zero operation, the switch 107 and the switch 108, as well as the switch 122 and the switch 132 turn ON, as illustrated in FIG. 13. With the switch 122 and the switch 132 turned ON, the FET 102 and the FET 104 are directly connected bypassing the diode-connected FET 121, and the FET 101 and the FET 103 are directly connected bypassing the diode-connected FET 131.

Figure 14:
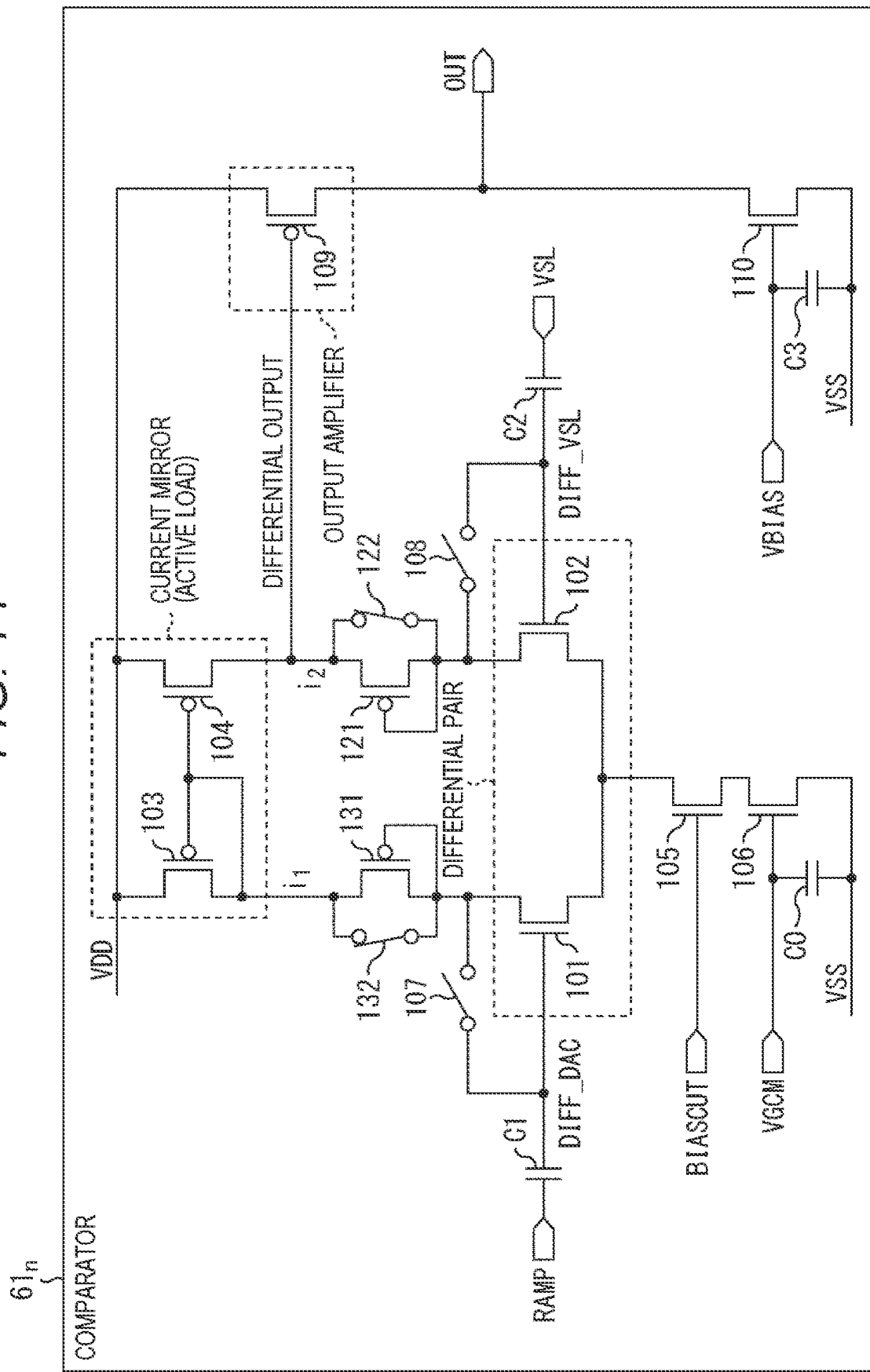
FIG. 14 is a drawing illustrating states of a switch 107 and a switch 108, as well as a switch 122 and a switch 132 in a third exemplary configuration of the comparator $61_n$, during comparison operation in a case where the VSL signal and the RAMP signal are subject to normal change.

FIG. 14 is a drawing illustrating states of a switch 107 and a switch 108, as well as a switch 122 and a switch 132 in a third exemplary configuration of the comparator $61_n$ in FIG. 13 during comparison operation where the VSL signal and the RAMP signal are subject to normal change.

In a case where the VSL signal and the RAMP signal are subject to the normal change in the third exemplary configuration of the comparator $61_n$ illustrated in FIG. 13, and during the comparison operation, the switch 107 and the switch 108 turn OFF, and the switch 122 and the switch 132 turn ON, as illustrated in FIG. 14. Accordingly, in a case where the VSL signal and the RAMP signal are subject to the normal change, the switch 122 and the switch 132 will remain normally-ON.

Figure 15:
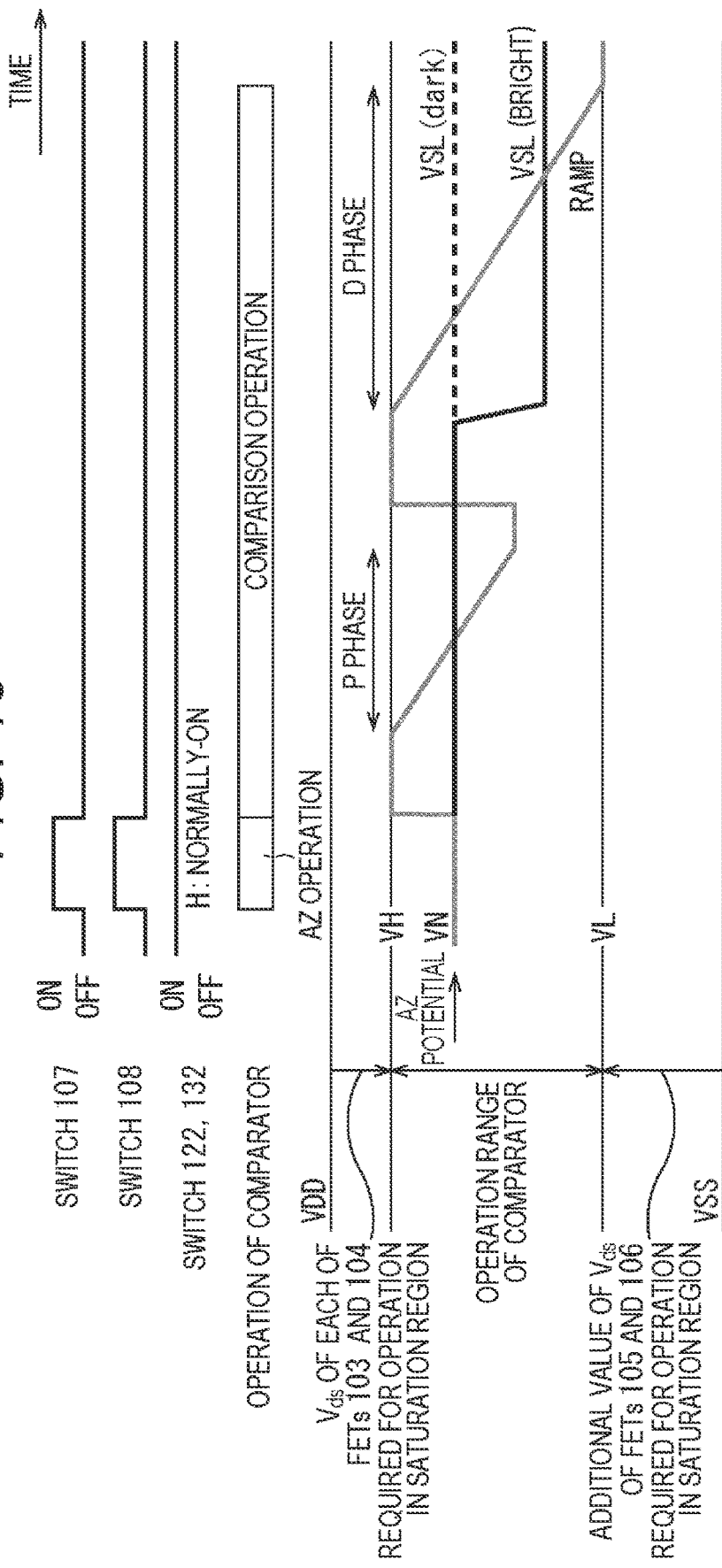
FIG. 15 is a timing chart illustrating an exemplary operation of the third exemplary configuration of the comparator $61_n$ in a case where the RAMP signal and the VSL signal are subject to normal change.

FIG. 15 is a timing chart illustrating an exemplary operation of the third exemplary configuration of the comparator $61_n$ in a case where the RAMP signal and the VSL signal are subject to the normal change.

FIG. 15 illustrates ON/OFF states of the switch 107 and the switch 108, operation of the comparator $61_n$, the RAMP signal, the VSL signal, and ON/OFF states of the switch 122 similarly to the case illustrated in FIG. 10. FIG. 15 further illustrates an ON/OFF state of the switch 132.

In a case where the RAMP signal and the VSL signal are subject to the normal change, the switch 122 and the switch 132 are brought into normally-ON. In the third exemplary configuration of the comparator $61_n$ illustrated in FIG. 13, the FET 102 and the FET 104 are therefore connected through the switch 122, and the FET 101 and the FET 103 are connected through the switch 132. That is, assuming there is no voltage drop in the switch 122 and the switch 132 for simplicity of explanation, the FET 102 and the FET 104 are now considered to be directly connected, and the FET 101 and the FET 103 are considered to be directly connected, similarly to the first exemplary configuration of the comparator 61$_n$ illustrated in FIG. 5.

The third exemplary configuration of the comparator 61$_n$ illustrated in FIG. 13 therefore operates, similarly to the first exemplary configuration of the comparator 61$_n$ illustrated in FIG. 5.

That is, in the comparator 61$_n$, the switch 107 and the switch 108 during the auto-zero operation (AZ operation) are turned ON. Both of the DIFF_DAC signal as the RAMP signal and the DIFF_VSL signal as the VSL signal therefore come to have the auto-zero potential (AZ potential) VN.

The auto-zero potential VN is given by voltage VDD-Vgsp2, remained after subtracting the gate-source voltage Vgsp2 of the FET 103, from the power source voltage VDD. The voltage VDD-Vgsp2, remained after subtracting the gate-source voltage Vgsp2 of the FET 103 from the power source voltage VDD, is also understood to be a voltage remained after subtracting the gate-source voltage of the FET 101 from the power source voltage VDD.

In the comparator 61$_n$, the switch 107 and the switch 108 turn OFF after the auto-zero operation, and the comparison operation starts.

In the comparison operation, AD conversion of the VSL signal is carried out in the way similar to that of FIG. 6 and FIG. 10.

That is, in a case where the RAMP signal that is subject to the normal change is used, the RAMP signal in the comparison operation is offset, prior to the start of P phase, so as to ascend by a predetermined voltage, and then allowed to be lowered in the P phase at a constant rate. A length of time ranging from the start of P phase, up to a point in time where the level relation between the RAMP signal and the reset-level VSL signal will be inverted, is then counted, and a count value thus obtained by the counting is assumed to be a result of AD conversion of the reset-level VSL signal.

After the end of the P phase, the RAMP signal is offset so as to elevate the voltage up to a level at the start of the P phase, and then allowed to descend at a constant rate in the D phase. A length of time ranging from the start of D phase, up to a point in time where the level relation between the RAMP signal and signal-level VSL signal will be inverted, is then counted, and a count value thus obtained by the counting is assumed to be a result of AD conversion of the signal-level VSL signal.

Since the VSL signal and the RAMP signal in FIG. 15 are subject to the normal change, similarly to the case illustrated in FIGS. 6 and 10, referring to the auto-zero potential given by voltage VN=VDD-Vgsp2, so that the RAMP signal and the VSL signal thus causing the normal change will fall within the operation range of the comparator 61$_n$.

Figure 16:
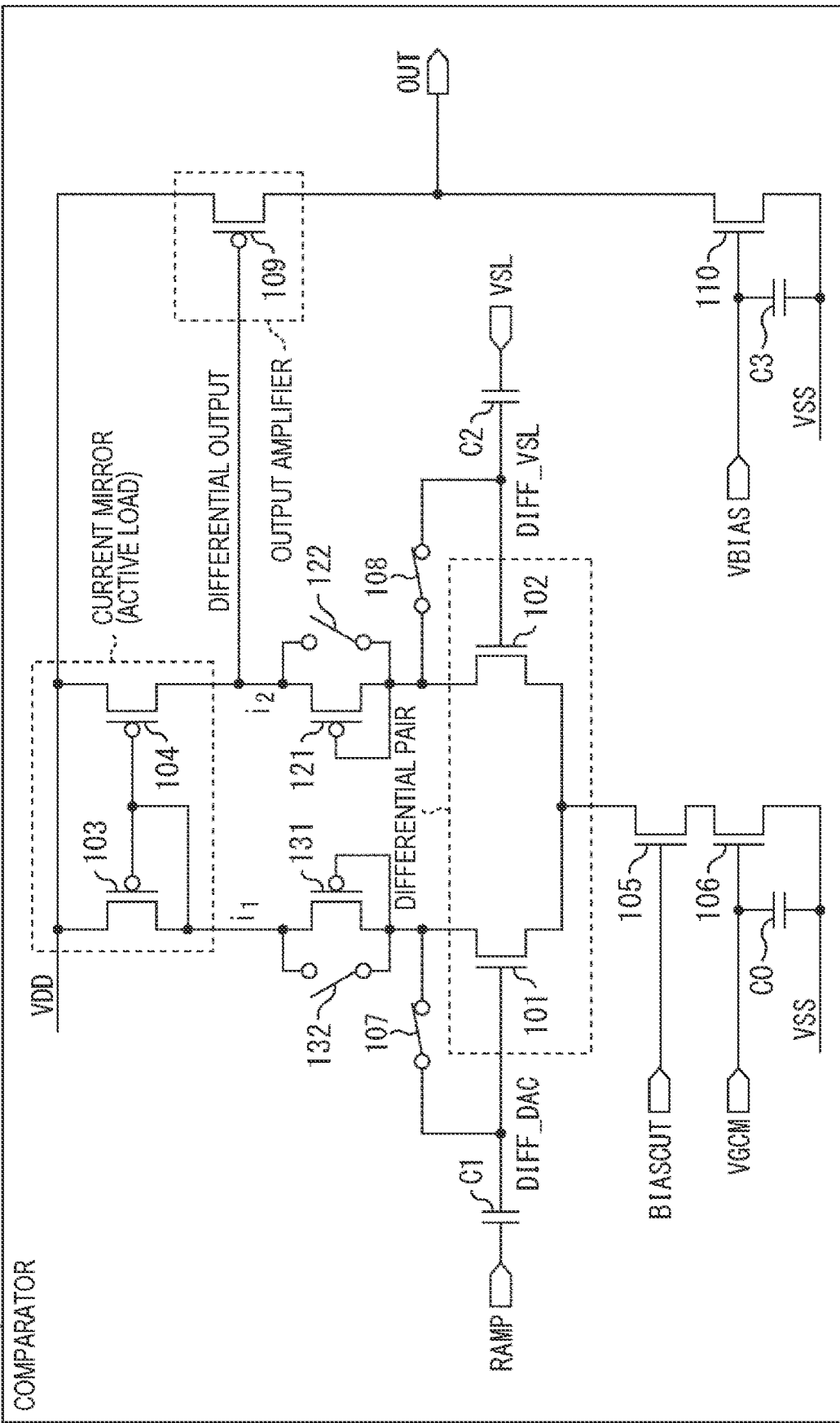
FIG. 16 is a drawing illustrating states of the switch 107 and the switch 108, as well as the switch 122 and the switch 132 in the third exemplary configuration of the comparator $61_n$, during auto-zero operation in a case where the VSL signal and the RAMP signal are subject to inversion change.

FIG. 16 is a drawing illustrating states of the switch 107 and the switch 108, as well as the switch 122 and the switch 132 in the third exemplary configuration of the comparator 61$_n$ in FIG. 13, during auto-zero operation where the VSL signal and the RAMP signal are subject to inversion change.

In a case where the VSL signal and the RAMP signal are subject to the inversion change during the auto-zero operation in the third exemplary configuration of the comparator 61$_n$ illustrated in FIG. 13, the switch 107 and the switch 108 turn ON, and the switch 122 and the switch 132 turn OFF, as illustrated in FIG. 16.

With the switch 122 and the switch 132 turned OFF, the FET 102 and the FET 104 are connected through the diode-connected FET 121, and the FET 101 and the FET 103 are connected through the diode-connected FET 131. As a consequence, voltage drop just equivalent to the gate-source voltage Vgsp3 of the FET 121 occurs at the diode-connected FET 121, between the FET 102 and the FET 104. Meanwhile, between the FET 101 and the FET 103, voltage drop equivalent to the gate-source voltage of the FET 131 occurs at the diode-connected FET 131.

Thus, the auto-zero potential in a case where the VSL signal and the RAMP signal are subject to the inversion change is given by VN-Vgsp3=VDD-Vgsp2-Vgsp3, which represents that the auto-zero potential, in a case where the VSL signal and the RAMP signal are subject to the inversion change, is smaller than the voltage VN, which is the auto-zero potential, in a case where the VLS signal and the RAMP signal are subject to the normal change, just by the gate-source voltage Vgsp3 of the FET 121.

Note that, the FET 103 and the FET 104 are assumed to have the same characteristics, and the FET 121 and the FET 131 are assumed to have the same characteristics. The auto-zero potential VN in a case where the VSL signal and the RAMP signal are subject to the normal change is given by voltage VDD-Vgsp2, which remains after subtracting the gate-source voltage Vgsp2 of the FET 103 from the power source voltage VDD, in which the voltage VDD-Vgsp2 is equal to voltage remained after subtracting the gate-source voltage of the FET 104 from the power source voltage VDD. Meanwhile, the auto-zero potential VR in a case where the VSL signal and the RAMP signal are subject to the inversion change is given by VN-Vgsp3=VDD-Vgsp2-Vgsp3, which represents that the auto-zero potential in a case where the VSL signal and the RAMP signal are subject to the inversion change is smaller than the voltage VN, which is the auto-zero potential in a case where the VLS signal and the RAMP signal are subject to the normal change, just by the gate-source voltage Vgsp3 of the FET 121, and the voltage VN-Vgsp3 is equal to voltage which is smaller than the voltage VN by the gate-source voltage of the FET 131.

In the third exemplary configuration of the comparator 61$_n$ illustrated in FIG. 13, the switch 107 and the switch 108 turn OFF, and the switch 122 and the switch 132 turn ON after the auto-zero operation as illustrated in FIG. 14, to start the comparison operation.

Figure 17:
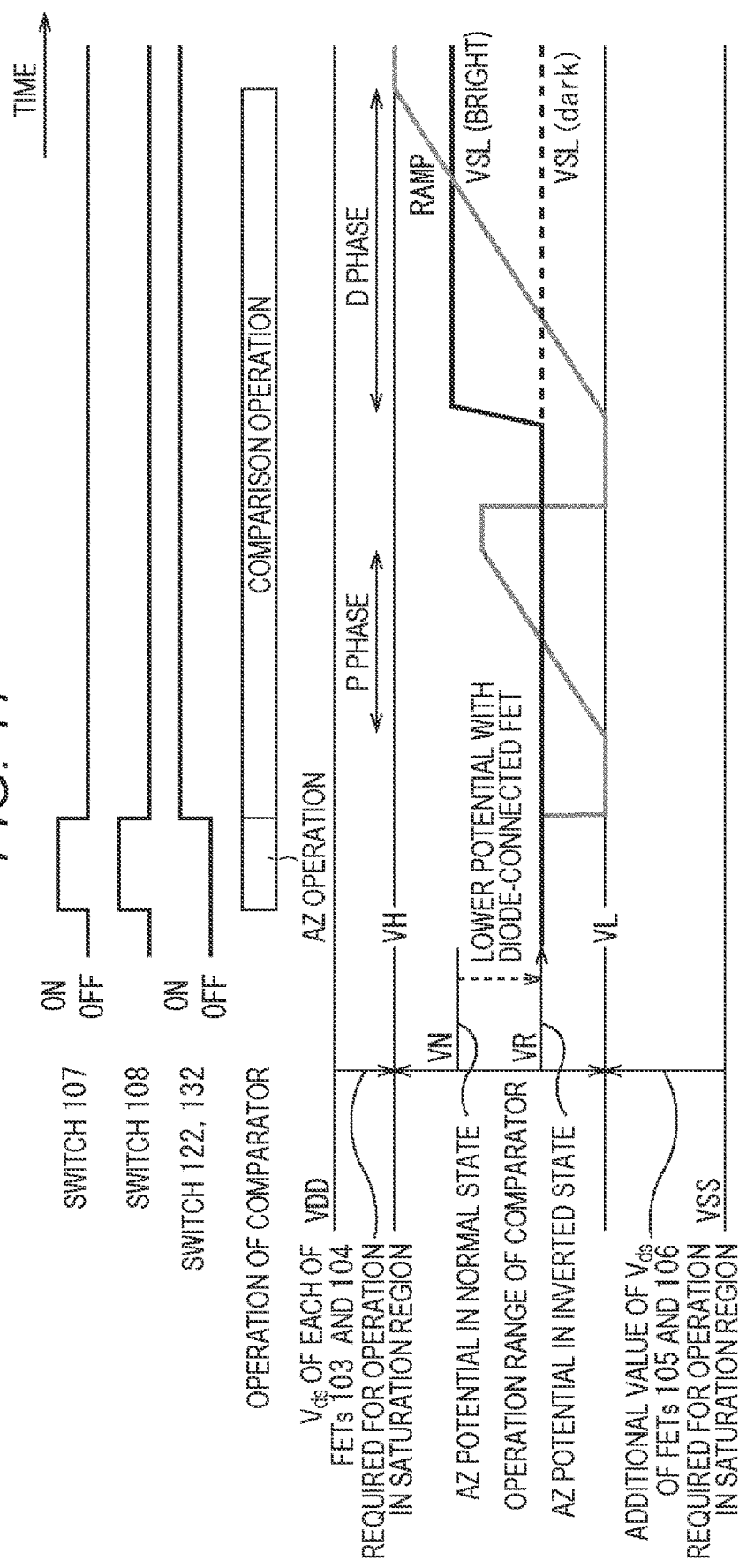
FIG. 17 is a timing chart explaining an exemplary operation of the third exemplary configuration of the comparator $61_n$, in a case where a RAMP signal and a VSL signal are subject to inversion change.

FIG. 17 is a timing chart explaining an exemplary operation of the third exemplary configuration of the comparator 61$_n$, in a case where a RAMP signal and a VSL signal are subject to inversion change.

FIG. 17 illustrates ON/OFF states of the switch 107 and the switch 108, operation of the comparator 61$_n$, the RAMP signal, the VSL signal, and ON/OFF states of the switch 122 similarly to the case illustrated in FIG. 12. FIG. 17 further illustrates an ON/OFF state of the switch 132.

The case in FIG. 17 is different from the case in FIG. 15, in that the RAMP signal and the VSL signal are subject to the inversion change, rather than to the normal change. The case in FIG. 17 is further different from the case in FIG. 15, in that the switch 122 turns OFF during the auto-zero operation, and, that the auto-zero potential is given by voltage VR which is lower, by the gate-source voltage Vgsp3 of the diode-connected FET 121 (or FET 131), than the auto-zero potential VN given in a case where the RAMP signal and the VSL signal are subject to the normal change.

In the comparator 61$_n$, the switch 107 and the switch 108 during the auto-zero operation (AZ operation) are turned ON, as well as the switch 122 and the switch 132 are turned OFF. Both of the DIFF_DAC signal as the RAMP signal and the DIFF_VSL signal as the VSL signal therefore come to have the auto-zero potential (AZ potential).

As has been explained referring to FIG. 16, with the switch 122 and the switch 132 turned OFF in a case where the RAMP signal and the VSL signal are subject to the inversion change, the voltage drop just equivalent to the gate-source voltage Vgsp3 of the FET 121 occurs at the diode-connected FET 121, between the FET 102 and the FET 104. Similarly, voltage drop just equivalent to the gate-source voltage of the FET 131 occurs at the diode-connected FET 131, between the FET 101 and the FET 103. As a result, the auto-zero potential VR in a case where the RAMP signal and the VSL signal are subject to the inversion change is given by VN-Vgsp3=VDD-Vgsp2-Vgsp3, which represents that the auto-zero potential, in a case where the VSL signal and the RAMP signal are subject to the inversion change, is smaller than the voltage VN, which is the auto-zero potential, in a case where the VLS signal and the RAMP signal are subject to the normal change, just by the gate-source voltage Vgsp3 of the FET 121. As described in FIG. 16, the voltage VN-Vgsp3 is equal to voltage which is smaller than the voltage VN by the gate-source voltage of the FET 131.

In the comparator 61$_n$, the switch 107 and the switch 108 turn OFF, and the switch 122 and the switch 132 turn ON after the auto-zero operation, to start the comparison operation.

In the comparison operation, AD conversion of the VSL signal is carried out similarly to the case of FIG. 12.

That is, in a case where the RAMP signal that is subject to the inversion change is used, the RAMP signal in the comparison operation is offset, prior to the start of P phase, so as to be lowered by a predetermined voltage, and then allowed to ascend in the P phase at a constant rate. A length of time ranging from the start of P phase, up to a point in time where the level relation between the RAMP signal and the reset-level VSL signal will be inverted, is then counted, and a count value thus obtained by the counting is assumed to be a result of AD conversion of the reset-level VSL signal.

After the end of the P phase, the RAMP signal is offset so as to descend the voltage to a level at the start of the P phase, and then allowed to ascend at a constant rate in the D phase. A length of time ranging from the start of D phase, up to a point in time where the level relation between the RAMP signal and signal-level VSL signal will be inverted, is then counted, and a count value thus obtained by the counting is assumed to be a result of AD conversion of the signal-level VSL signal.

Since the VSL signal and the RAMP signal in FIG. 17 are subject to the inversion change, referring to voltage VR=VN-Vgsp3 which is lower, just by the gate-source voltage Vgsp3 of the FET 121, than the auto-zero potential VN illustrated in FIG. 15, so that the RAMP signal and the VSL signal thus being subjected to the inversion change can be fallen within the operation range of the comparator 61$_n$.

It becomes therefore possible to prevent the RAMP signal and the VSL signal subjected to the inversion change from exceeding the operation range of the comparator 61$_n$ which is not lower than the voltage VL and not higher than the voltage VH, and from surpassing the voltage VH as illustrated in FIG. 7, and therefore it becomes possible to prevent the linearity of AD conversion from degrading. In addition, according to the third exemplary configuration of the comparator 61$_n$ illustrated in FIG. 17, the similar effects as the second exemplary configuration of the comparator 61$_n$ illustrated in FIG. 8 can be obtained.

In addition, since in the third exemplary configuration of the comparator 61$_n$ illustrated in FIG. 17, the differential amplifier that includes the differential pair and the current mirror is bilaterally symmetrical, so that the differential amplifier is, as it were, bilaterally balanced. As a consequence, the comparator 61$_n$ is typically suppressed from causing unbalanced operation between the cases where the RAMP signal and the VSL signal are subject to the normal change, and to the inversion change.

<Fourth Exemplary Configuration of Comparator 61$_n$>

Figure 18:
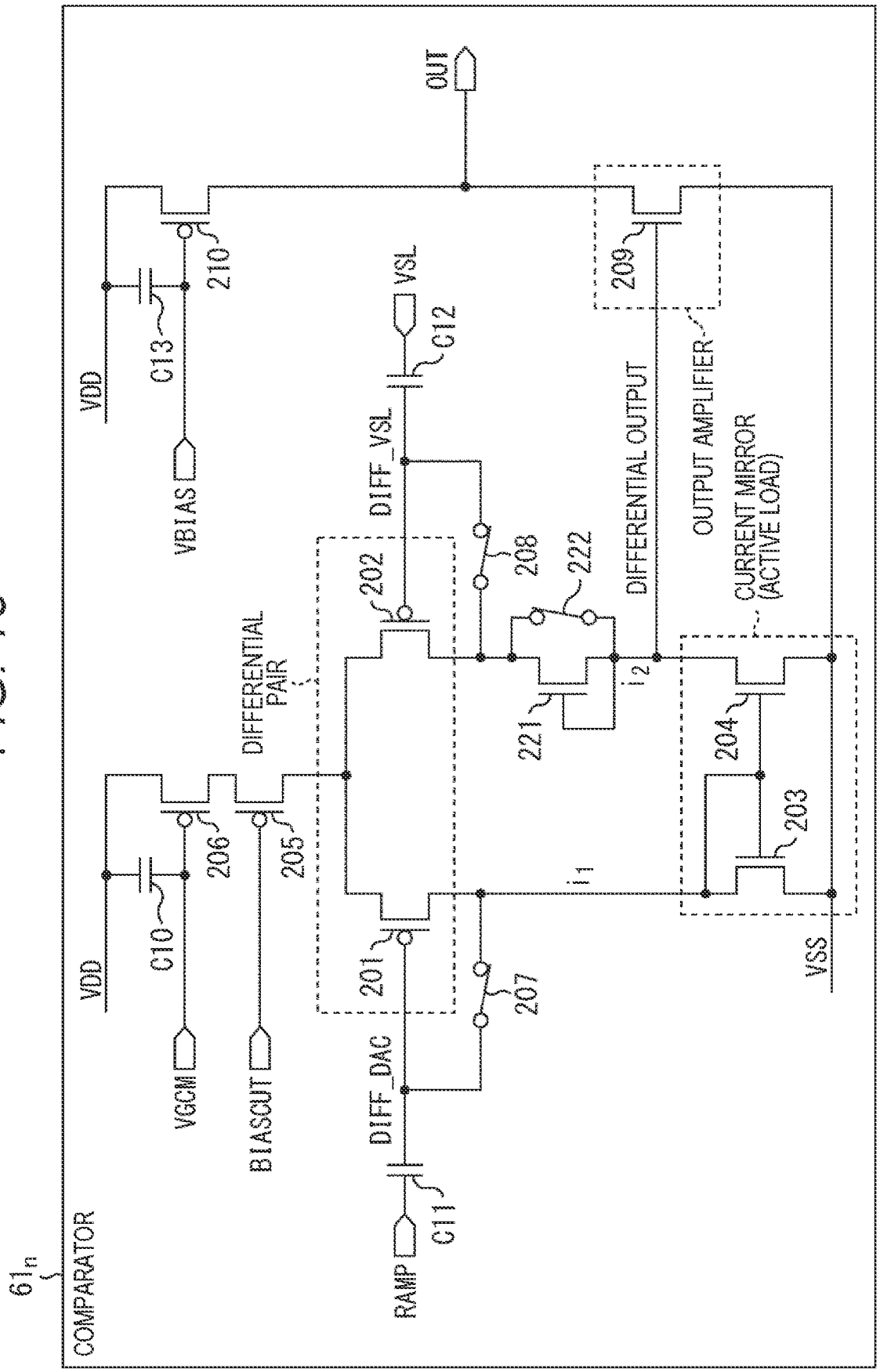
FIG. 18 is a circuit diagram illustrating a fourth exemplary configuration of a comparator $61_n$.

FIG. 18 is a circuit diagram illustrating a fourth exemplary configuration of a comparator 61$_n$ in FIG. 4.

Now, although the second exemplary configuration of the comparator 61$_n$, illustrated in FIG. 8 is a so-called N-top type comparator, the comparator 61$_n$ may alternatively be configured as a P-top type comparator. A fourth exemplary configuration of the comparator 61$_n$ illustrated in FIG. 18 is a P-top type comparator, corresponded to the second exemplary configuration of the comparator 61$_n$ illustrated in FIG. 8.

In FIG. 18, the comparator 61$_n$ has a PMOS FET 201 and a PMOS FET 202, an NMOS FET 203 and an NMOS FET 204, a PMOS FET 205 and a PMOS FET 206, a switch 207 and a switch 208, an NMOS FET 209, a PMOS FET 210, capacitors C10, C11, C12, and C13, an NMOS FET 221, as well as a switch 222.

The FET 201 to FET 210, the capacitors C10 to C13, the FET 221, and the switch 222 correspond respectively, in FIG. 8, to the FET 101 to FET 110, the capacitors C0 to C3, the FET 121, and the switch 122.

Further, the fourth exemplary configuration of the comparator 61$_n$ illustrated in FIG. 18 is configured similarly to the case of FIG. 8, except for that the polarity is inverted from FIG. 8, that is, the side connected to the power source voltage VDD in FIG. 8 is connected to the power source voltage VSS in FIG. 18, and the side connected to the power source voltage VSS in FIG. 8 is connected to the power source voltage VDD in FIG. 18, so that the explanation will be skipped.

The fourth exemplary configuration of the comparator 61$_n$ illustrated in FIG. 18 can demonstrate an effect similar to that of the second exemplary configuration of the comparator 61$_n$ illustrated in FIG. 8.

<Fifth Exemplary Configuration of Comparator 61$_n$>

Figure 19:
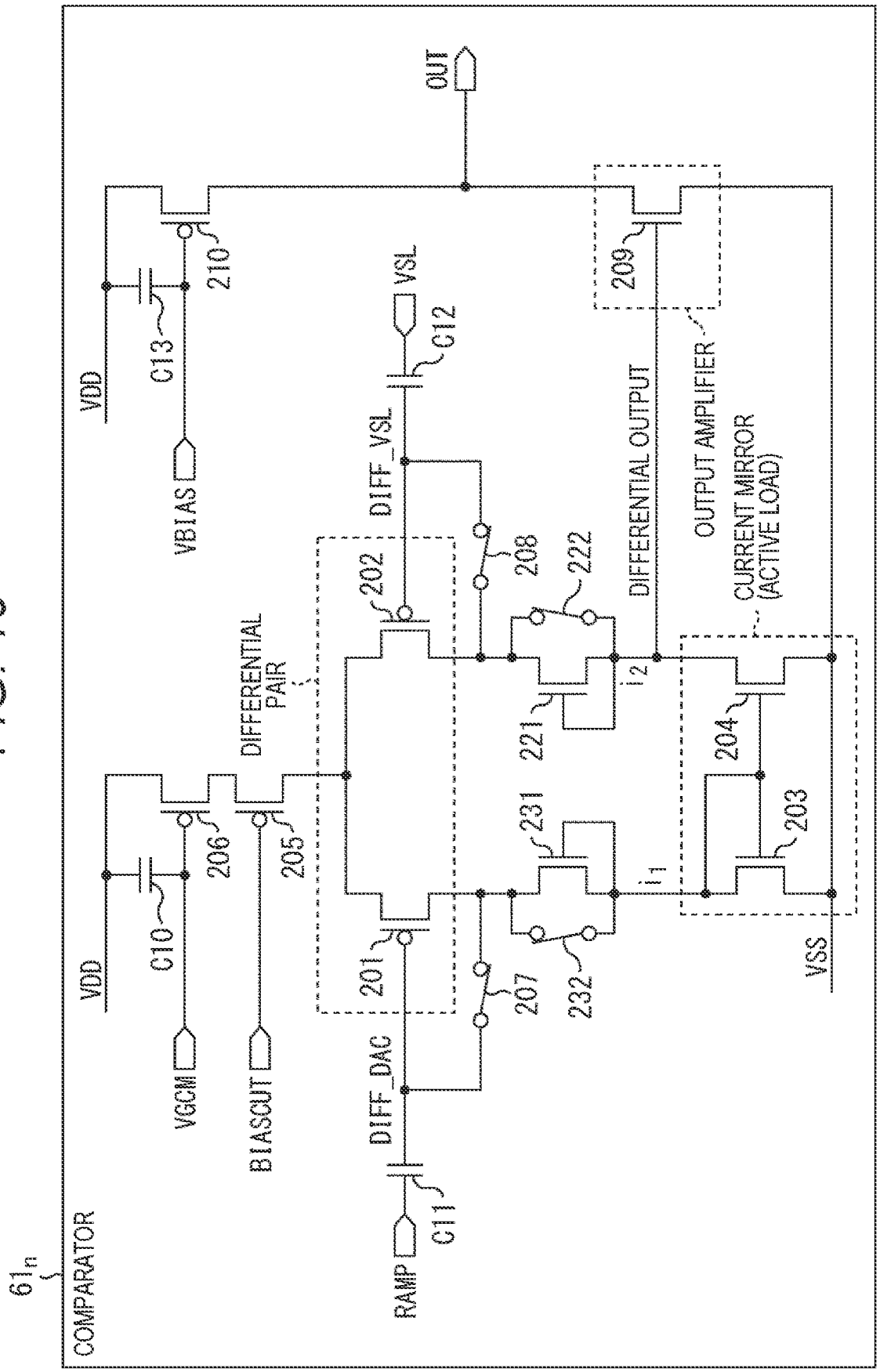
FIG. 19 is a circuit diagram illustrating a fifth exemplary configuration of a comparator $61_n$.

FIG. 19 is a circuit diagram illustrating a fifth exemplary configuration of a comparator 61$_n$ in FIG. 4.

Note that, the third exemplary configuration of the comparator 61$_n$ illustrated in FIG. 13 was an N-top type comparator, similarly to the case in FIG. 8. The fifth exemplary configuration of the comparator 61$_n$ illustrated in FIG. 19 is a P-top type comparator corresponded to the third exemplary configuration of the N-top type comparator 61$_n$ illustrated in FIG. 13.

In FIG. 19, the comparator 61$_n$ has a PMOS FET 201 and a PMOS FET 202, an NMOS FET 203 and an NMOS FET 204, a PMOS FET 205 and a PMOS FET 206, a switch 207 and a switch 208, an NMOS FET 209, a PMOS FET 210, capacitors C10, C11, C12, and C13, an NMOS FET 221, a switch 222, an NMOS FET 231, as well as a switch 232.

The FET 201 to FET 210, the capacitors C10 to C13, the FET 221, the switch 222, the FET 231, and the switch 232 correspond respectively, in FIG. 13, to the FET 101 to FET 110, the capacitors C0 to C3, the FET 121, the switch 122, the FET 131, and the switch 132.

Further, the fifth exemplary configuration of the comparator 61$_n$ illustrated in FIG. 19 is configured similarly to the case in FIG. 13, except for that the polarity is inverted from FIG. 13, that is, the side connected to the power source voltage VDD in FIG. 13 is connected to the power source voltage VSS in FIG. 19, and the side connected to the power source voltage VSS in FIG. 13 is connected to the power source voltage VDD in FIG. 19, so that the explanation will be skipped.

The fifth exemplary configuration of the comparator 61$_n$ illustrated in FIG. 19 can demonstrate an effect similar to that of the third exemplary configuration of the comparator 61$_n$ illustrated in FIG. 13.

Note that the comparator 61$_n$ may alternatively be configured by using a transistor other than FET, for example, such as a bipolar transistor or the like.

In addition, the auto-zero potential may be made adjustable at three or more levels depending on (the number of) switches 122 to be turned ON/OFF, by providing in series a plurality of sets of the FET 121 and the switch 122 (same will apply to the FET 131 and 132, to the FET 221 and the switch 222, and to the FET 231 and the switch 232).

<Usage Examples of Image Sensor>

Figure 20:
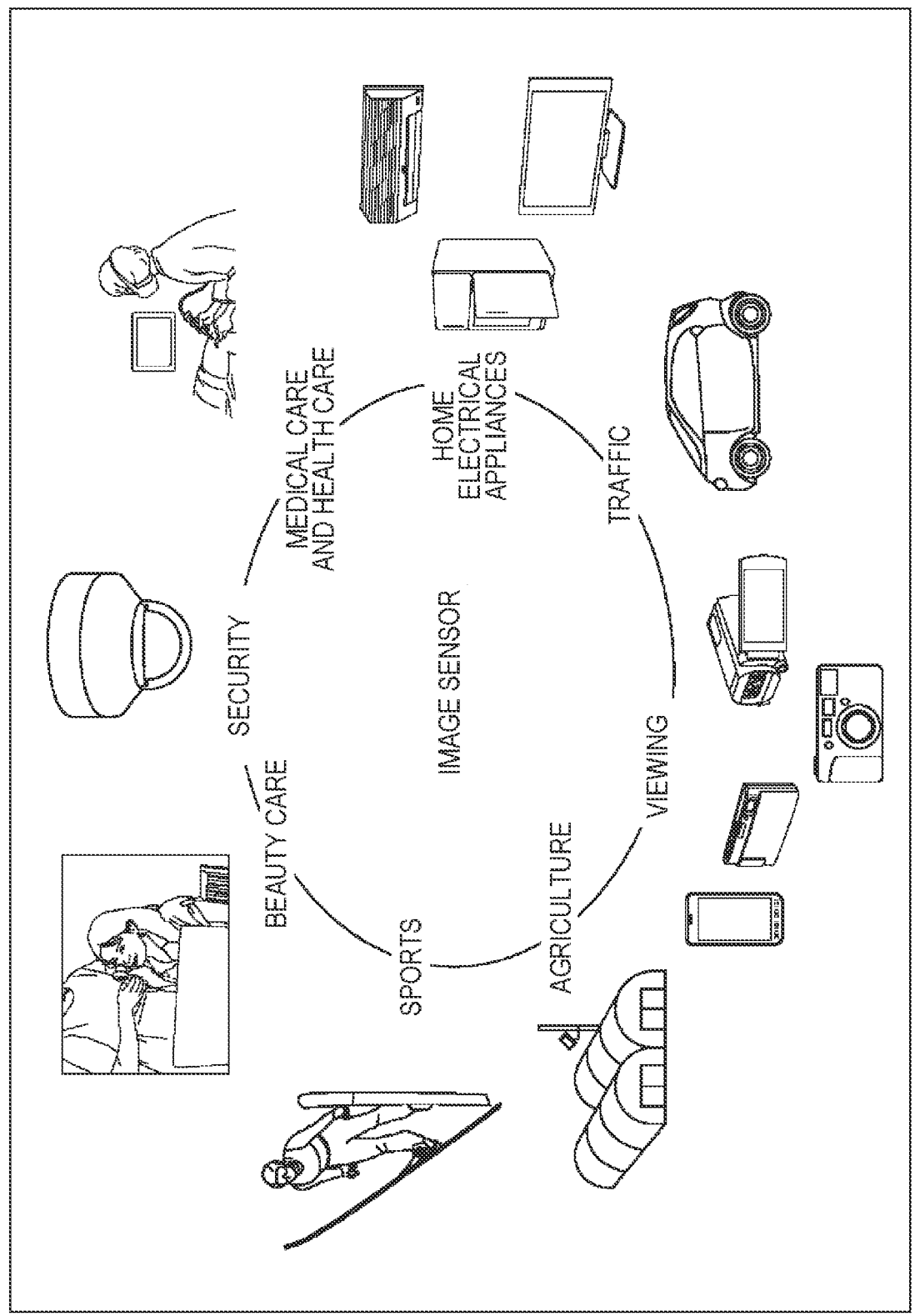
FIG. 20 is a diagram illustrating a usage example of an image sensor 2.

FIG. 20 illustrates the usage examples of the image sensor 2 in FIG. 1.

The image sensor 2 can be used for, for example, various electronic devices which detects light such as visible light, infrared light, ultraviolet light, or X-rays as follows.

Electronic devices that take images used for viewing, such as a digital camera and a portable appliance with a camera function.

Electronic devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.

Electronic devices used for home electrical appliances, such as a TV, a refrigerator, and an air conditioner, to takes images of a gesture of a user and perform appliance operation in accordance with the gesture.

Electronic devices used for medical care and health care, such as an endoscope, an electronic microscope, and a device that performs angiography by reception of infrared light.

Electronic devices used for security, such as a monitoring camera for crime prevention and a camera for personal authentication.

Electronic devices used for beauty care, such as skin measurement equipment that takes images of the skin and a microscope that takes images of the scalp.

Electronic devices used for sports, such as an action camera and a wearable camera for sports and the like.

Electronic devices used for agriculture, such as a camera for monitoring the condition of the field and crops.

<Application Example to Mobile Object>

A technology (present technology) according to the present disclosure can be applied to various products. For example, the technology according to the present disclosure may also be realized as a device mounted in a mobile object of any type such as automobile, electric vehicle, hybrid electric vehicle, motorcycle, bicycle, personal mobility, airplane, drone, ship, or robot.

Figure 21:
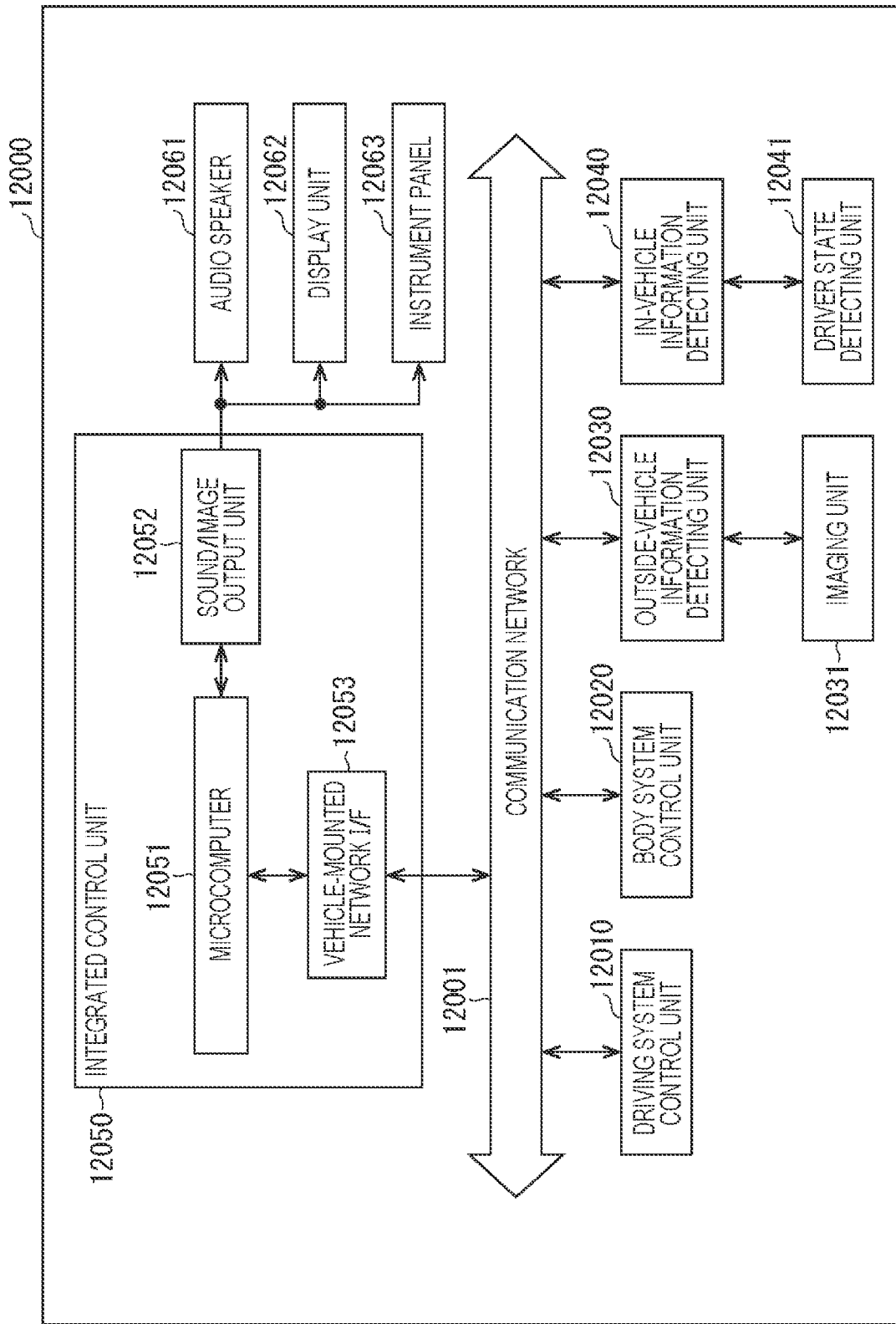
FIG. 21 is a block diagram depicting an example of schematic configuration of a vehicle control system.

FIG. 21 is a block diagram depicting an example of schematic configuration of a vehicle control system as an example of a mobile object control system to which the technology according to the present disclosure can be applied.

The vehicle control system 12000 includes a plurality of electronic control units connected to each other via a communication network 12001. In the example depicted in FIG. 21, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output unit 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging unit 12031. The outside-vehicle information detecting unit 12030 makes the imaging unit 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging unit 12031 is an optical sensor that receives light, and which outputs an electric signal corresponding to a received light amount of the light. The imaging unit 12031 can output the electric signal as an image, or can output the electric signal as information about a measured distance. In addition, the light received by the imaging unit 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting unit 12041 that detects the state of a driver. The driver state detecting unit 12041, for example, includes a camera that images the driver. On the basis of detection information input from the driver state detecting unit 12041, the in-vehicle information detecting unit 12040 may calculate a degree of fatigue of the driver or a degree of concentration of the driver, or may determine whether the driver is dozing or not.

The microcomputer 12051 can calculate a control target value for the driving force generating device, the steering mechanism, or the braking device on the basis of the information about the inside or outside of the vehicle which is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the surroundings of the vehicle which is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output unit 12052 transmits an output signal of at least one of a sound or an image to an output device capable of visually or auditorily notifying an occupant of the vehicle or the outside of the vehicle of information. In the example of FIG. 21, an audio speaker 12061, a display unit 12062, and an instrument panel 12063 are illustrated as the output device. The display unit 12062 may, for example, include at least one of an on-board display or a head-up display.

Figure 22:
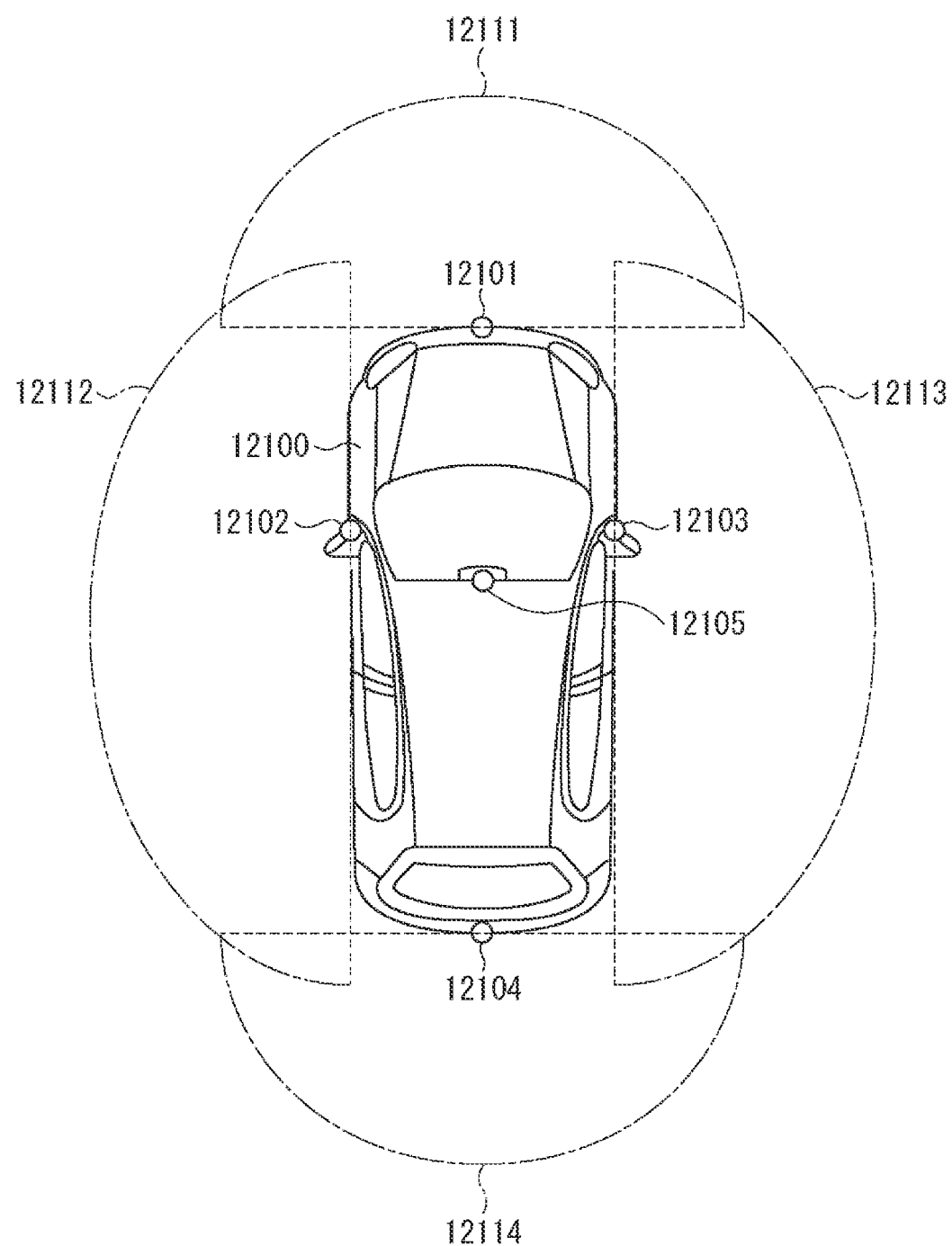
FIG. 22 is a diagram of assistance in explaining an example of installation positions of an outside-vehicle information detecting unit and an imaging unit.

FIG. 22 is a diagram depicting an example of the installation position of the imaging unit 12031.

In FIG. 22, a vehicle 12100 includes imaging units 12101, 12102, 12103, 12104, and 12105 as the imaging unit 12031.

The imaging units 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle or the like. The imaging unit 12101 provided to the front nose and the imaging unit 12105 provided to the upper portion of the windshield within the interior of the vehicle obtain mainly an image of the front of the vehicle 12100. The imaging units 12102 and 12103 provided to the sideview mirrors obtain mainly an image of the sides of the vehicle 12100. The imaging unit 12104 provided to the rear bumper or the back door obtains mainly an image of the rear of the vehicle 12100. The image of the front of the vehicle obtained by the imaging units 12101 and 12105 is used mainly to detect a preceding vehicle, a pedestrian, an obstacle, a signal, a traffic sign, a lane, or the like.

Incidentally, FIG. 22 depicts an example of imaging ranges of the imaging units 12101 to 12104. An imaging range 12111 represents the imaging range of the imaging unit 12101 provided to the front nose. Imaging ranges 12112 and 12113 respectively represent the imaging ranges of the imaging units 12102 and 12103 provided to the sideview mirrors. An imaging range 12114 represents the imaging range of the imaging unit 12104 provided to the rear bumper or the back door. A bird's-eye image of the vehicle 12100 as viewed from above is obtained by superimposing image data imaged by the imaging units 12101 to 12104, for example.

At least one of the imaging units 12101 to 12104 may have a function of obtaining distance information. For example, at least one of the imaging units 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging units 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole or the like, and other three-dimensional objects on the basis of the distance information obtained from the imaging units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display unit 12062, and performs forced deceleration or avoidance steering via the driving system control unit 12010. The microcomputer 12051 can thereby assist in driving to avoid collision.

At least one of the imaging units 12101 to 12104 may be an infrared camera that detects infrared rays. The microcomputer 12051 can, for example, recognize a pedestrian by determining whether or not there is a pedestrian in imaged images of the imaging units 12101 to 12104. Such recognition of a pedestrian is, for example, performed by a procedure of extracting characteristic points in the imaged images of the imaging units 12101 to 12104 as infrared cameras and a procedure of determining whether or not it is the pedestrian by performing pattern matching processing on a series of characteristic points representing the contour of the object. If the microcomputer 12051 determines that there is a pedestrian in the imaged images of the imaging units 12101 to 12104, and thus recognizes the pedestrian, the sound/image output unit 12052 controls the display unit 12062 so that a square contour line for emphasis is displayed so as to be superimposed on the recognized pedestrian. In addition, the sound/image output unit 12052 may also control the display unit 12062 so that an icon or the like representing the pedestrian is displayed at a desired position.

An exemplary vehicle control system, to which the technology according to the present disclosure is applicable, has been explained. The technology according to the present disclosure is applicable for example to the imaging unit 12031 in the aforementioned configuration. More specifically, for example, the image sensor 2 illustrated in FIG. 2, having the comparator 61$_n$ illustrated in FIG. 5, FIG. 8, FIG. 13, FIG. 18 and FIG. 19, is applicable to the imaging unit 12031. By applying the technology according to the present disclosure to the imaging unit 12031, it now becomes possible to configure, at low cost, the imaging unit 12031 capable of coping with both of cases where the RAMP signal and the VSL signal are subject to the normal change and to the inversion change, and the vehicle 12100 is therefore suppressed from becoming expensive.

Further, an embodiment of the present technology is not limited to the embodiments described above, and various changes and modifications may be made without departing from the scope of the present technology.

Further, the advantageous effects described in the present specification are merely exemplary and are not limiting, and additional advantageous may be obtained.

Additionally, the present technology may also be configured as below.

<1>
A comparator including:
a differential pair to which a pixel signal output from a pixel, and, a reference signal with changeable voltage are input;
a current mirror connected to the differential pair;
a voltage drop mechanism that is connected between a transistor that configures the differential pair, and a transistor that configures the current mirror, being allowed to cause a predetermined voltage drop; and
a switch connected in parallel to the voltage drop mechanism.

<2>
The comparator according to <1>, in which
the voltage drop mechanism includes a diode-connected transistor.

<3>
The comparator according to <1> or <2>, in which
in a case where the reference signal is subject to a normal change to drop the voltage, the switch is turned ON both during an auto-zero operation that determines operating point potential of the comparator, and, during a comparison operation that compares the pixel signal and the reference signal;
meanwhile in a case where the reference signal is subject to an inversion change to elevate the voltage, the switch is turned OFF during the auto-zero operation, and turned ON during the comparison operation.

<4>
The comparator according to any one of <1> to <3>, further including:
a first voltage drop mechanism connected between one transistor out of a pair of transistors that configures the differential pair, and one transistor out of a pair of transistors that configures the current mirror; and
a first switch connected in parallel to the first voltage drop mechanism,
respectively as the voltage drop mechanism and the switch.

<5>
The comparator according to <4>, further including:
a second voltage drop mechanism connected between the other transistor out of the pair of transistors that configures the differential pair, and the other transistor out of the pair of transistors that configures the current mirror; and
a second switch connected in parallel to the second voltage drop mechanism,
respectively as the voltage drop mechanism and the switch.

<6>
The comparator according to any one of <1> to <5>, in which
a transistor to which the pixel signal is input, out of the pair of transistors that configures the differential pair, is connected to an amplifier that outputs an output signal of the comparator.

<7>
An imaging device including:
a pixel that outputs a pixel signal as a result of photoelectric conversion;
a comparator that compares the pixel signal, and a reference signal with changeable voltage; and
a counter that counts a length of time required for change of the reference signal until the pixel signal and the reference signal will coincide, on the basis of a result of comparison between the pixel signal and the reference signal given by the comparator, and determines an obtained count value as a result of analog-to-digital (AD) conversion of the pixel signal,
the comparator including:
a differential pair to which the pixel signal and the reference signal are input;
a current mirror connected to the differential pair;
a voltage drop mechanism that is connected between a transistor that configures the differential pair, and a transistor that configures the current mirror, being allowed to cause a predetermined voltage drop; and
a switch connected in parallel to the voltage drop mechanism.

REFERENCE SIGNS LIST

1 Optical system
2 Image sensor
3 Memory
4 Signal processing unit
5 Output unit
6 Control unit
10 Pixel array
11$_{1,1}$ to 11$_{m,N}$ Pixel
20 Control unit
21 Pixel drive unit
22 Column-parallel AD conversion unit
31$_1$ to 31$_N$ ADC
32 Auto-zero control unit
32A Auto-zero signal line
33 Reference signal output unit
33A Reference signal line
34 Clock output unit
34A Clock signal line
41$_1$ to 41$_m$ Pixel control line
42$_1$ to 42$_N$ VSL
43$_1$ to 43$_N$ Current source
51 PD
52 Transfer Tr
53 FD 54 Reset t Tr
55 Amplification Tr
56 Selection Tr
$61_1$ to $61_N$ Comparator
$62_1$ to $62_N$ Counter
101 to 106 FET
107, 108 Switch
109, 110, 121 FET
122 Switch
131 FET
132 Switch
201 to 206 FET
207, 208 Switch
209, 210, 221 FET
222 Switch
231 FET
232 Switch

The invention claimed is:

1. A comparator comprising:
  a differential pair comprised of:
    a first transistor configured to receive a pixel signal from a pixel unit, and
    a second transistor configured to receive a reference signal from a reference signal output unit;
  a current mirror electrically connected to the differential pair;
  a voltage drop mechanism electrically connected between the current mirror and the differential pair;
  a switch electrically connected in parallel to the voltage drop mechanism;
  a current source electrically connected to the differential pair,
  wherein the current source comprises a third transistor, a fourth transistor and a capacitor,
  wherein the third transistor is electrically connected to the first transistor and the second transistor,
  wherein the fourth transistor is electrically connected to the third transistor, and
  wherein the capacitor is electrically connected to a gate of the fourth transistor.

2. The comparator according to claim 1, wherein the voltage drop mechanism includes a diode-connected transistor.

3. The comparator according to claim 1, wherein the comparator is configured to:
  determine, when the comparator performs an auto-zero operation, an operating point potential of the comparator.

4. The comparator according to claim 3, wherein the comparator is configured to:
  compare, when the comparator performs a comparison operation, the pixel signal to the reference signal.

5. The comparator according to claim 4, wherein the switch, when the pixel signal and the reference signal are subject to a normal change, is configured to be positioned:
  in an ON position when the comparator performs the auto-zero operation, and
  in an ON position when the comparator performs the comparison operation.

6. The comparator according to claim 1, wherein the switch, when the pixel signal and the reference signal are subject to an inversion change, is configured to be positioned:
  in an OFF position when the comparator performs the auto-zero operation, and
  in an ON position when the comparator performs the comparison operation.

7. The comparator according to claim 1, wherein the switch, when in the OFF position, is configured to electrically connect the current mirror to the differential pair through the voltage drop mechanism.

8. The comparator according to claim 1, wherein the switch, when in the ON position, is configured to electrically connect the current mirror directly to the differential pair.

9. The comparator according to claim 1, wherein the switch is electrically connected the current mirror to an amplifier.

10. The comparator according to claim 1, further comprising:
  another voltage drop mechanism electrically connected between the current mirror and the differential pair, and
  another switch electrically connected in parallel to said another voltage drop mechanism.

11. An imaging device comprising:
  a pixel that outputs a pixel signal as a result of photoelectric conversion;
  a comparator that compares the pixel signal with a reference signal; and
  a counter that counts a length of time on a basis of a result of comparison between the pixel signal and the reference signal by the comparator, and determines a count value as a result of analog-to-digital (AD) conversion of the pixel signal,
  the comparator comprising:
  a differential pair comprising:
    a first transistor configured to receive the pixel signal from a pixel unit, and
    a second transistor configured to receive the reference signal from a reference signal output unit;
  a current mirror electrically connected to the differential pair;
  a voltage drop mechanism electrically connected between the current mirror and the differential pair;
  a switch electrically connected in parallel to the voltage drop mechanism;
  a current source electrically connected to the differential pair,
  wherein the current source comprises a third transistor, a fourth transistor and a capacitor,
  wherein the third transistor is electrically connected to the first transistor and the second transistor,
  wherein the fourth transistor is electrically connected to the third transistor, and
  wherein the capacitor is electrically connected to a gate of the fourth transistor.

* * * * *